US011776474B2

(12) United States Patent
Lee et al.

(10) Patent No.: US 11,776,474 B2
(45) Date of Patent: Oct. 3, 2023

(54) DISPLAY DEVICE

(71) Applicant: Samsung Display Co., Ltd., Yongin-si (KR)

(72) Inventors: Yujin Lee, Suwon-si (KR); Heejean Park, Suwon-si (KR); Heerim Song, Seoul (KR); Cheol-Gon Lee, Suwon-si (KR); Mukyung Jeon, Ulsan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/702,136

(22) Filed: Mar. 23, 2022

(65) Prior Publication Data

US 2022/0366849 A1 Nov. 17, 2022

(30) Foreign Application Priority Data

May 14, 2021 (KR) ........................ 10-2021-0063016

(51) Int. Cl.
  *G09G 3/3233* (2016.01)
  *H10K 59/121* (2023.01)
  *H10K 59/124* (2023.01)
  *H10K 59/131* (2023.01)

(52) U.S. Cl.
  CPC ......... *G09G 3/3233* (2013.01); *H10K 59/124* (2023.02); *H10K 59/1216* (2023.02); *H10K 59/131* (2023.02)

(58) Field of Classification Search
  CPC .............. G09G 3/3233; H01L 27/3258; H01L 27/3265; H01L 27/3276; H10K 59/131; H10K 59/124; H10K 59/1216
  See application file for complete search history.

(56) References Cited

U.S. PATENT DOCUMENTS

| | | | |
|---|---|---|---|
| 8,629,842 B2 | 1/2014 | Jang | |
| 8,817,007 B2* | 8/2014 | Lee | G09G 3/3233 345/212 |
| 9,934,723 B2* | 4/2018 | Lee | H01L 27/3279 |
| 10,236,332 B2 | 3/2019 | Jung et al. | |
| 10,510,302 B2* | 12/2019 | Yoo | G09G 3/3266 |
| 10,622,436 B2* | 4/2020 | Park | H10K 59/131 |
| 10,978,538 B2 | 4/2021 | Wang | |

(Continued)

FOREIGN PATENT DOCUMENTS

KR       101084169 B1    11/2011
KR    1020170080223 A     7/2017

(Continued)

*Primary Examiner* — Sardis F Azongha
(74) *Attorney, Agent, or Firm* — CANTOR COLBURN LLP

(57) ABSTRACT

A pixel includes a driving transistor, a switching transistor, and first and second capacitors. The gate of the driving transistor is disposed below a first insulating layer, and a first conductive pattern defining a first electrode of the first capacitor is disposed below the first insulating layer. A second conductive pattern defining a second electrode of the first capacitor and a first electrode of the second capacitor is disposed on the first insulating layer, a third conductive pattern defining a second electrode of the second capacitor is disposed on a second insulating layer covering the second conductive pattern, and the data line is disposed above the second insulating layer.

20 Claims, 17 Drawing Sheets

(56) References Cited

U.S. PATENT DOCUMENTS

| | | | |
|---|---|---|---|
| 11,133,370 B2* | 9/2021 | Yoon | H01L 51/5253 |
| 11,177,333 B2* | 11/2021 | Park | H01L 27/124 |
| 2016/0240565 A1* | 8/2016 | Kim | H01L 27/0922 |

FOREIGN PATENT DOCUMENTS

| | | |
|---|---|---|
| KR | 102000642 B1 | 7/2019 |
| KR | 1020200029103 A | 3/2020 |

* cited by examiner

DISPLAY DEVICE

This application claims priority to Korean Patent Application No. 10-2021-0063016, filed on May 14, 2021, and all the benefits accruing therefrom under 35 U.S.C. § 119, the content of which in its entirety is herein incorporated by reference.

BACKGROUND

1. Field

The disclosure herein relates to a display device, and more particularly, to a display device having an oxide transistor.

2. Description of the Related Art

A display device includes a plurality of pixels and a driving circuit (e.g., a scan driving circuit and a data driving circuit) for controlling the plurality of pixels. Each of the plurality of pixels includes a display element and a pixel driving circuit for controlling the display element. The pixel driving circuit may include a plurality of organically connected transistors.

In such a display device, the scan driving circuit and/or the data driving circuit may be formed through a same process as the plurality of pixels. The scan driving circuit and/or the data driving circuit may include a plurality of transistors.

SUMMARY

The disclosure provides a display device with improved display quality.

An embodiment of the invention provides a display device including a display panel including: a plurality of insulating layers; a first pixel electrically connected to a first data line extending in a first direction and a first scan line extending in a second direction crossing the first direction; and a second pixel electrically connected to a second data line extending in the second direction and the first scan line. In such an embodiment, the first pixel includes: a light-emitting diode including a first electrode electrically connected to a first node, a second electrode which receives a first power voltage, and a light-emitting layer disposed between the first electrode and the second electrode; a first transistor including a source, a drain, a semiconductor region, and a gate electrically connected to a second node, where the first transistor is electrically connected between a first voltage line which receives a second power voltage and the first node; a second transistor electrically connected between the first data line and the second node; a third transistor electrically connected between the second node and a second voltage line which receives a first voltage; a first capacitor electrically connected between the first node and the second node; a fourth transistor electrically connected between a third voltage line which receives a second voltage and the first node; a fifth transistor electrically connected between the first voltage line and the drain or the source of the first transistor; and a second capacitor electrically connected between the first voltage line and the first node. In such an embodiment, the plurality of insulating layers includes a first insulating layer and a second insulating layer disposed on the first insulating layer, the gate of the first transistor is disposed below the first insulating layer, a first conductive pattern defining a first electrode of the first capacitor is disposed below the first insulating layer, a second conductive pattern defining a second electrode of the first capacitor and a first electrode of the second capacitor is disposed between the first insulating layer and the second insulating layer, a third conductive pattern defining a second electrode of the second capacitor is disposed on the second insulating layer, and the first data line is disposed above the second insulating layer.

In an embodiment, the second conductive pattern may be disposed between the first data line and the second data line, and a partial region of the third conductive pattern overlapping the second conductive pattern may be disposed between the first data line and the second data line.

In an embodiment, an opening may be defined in the third conductive pattern in a plan view.

In an embodiment, a connection electrode disposed through the opening may electrically connect the second conductive pattern and the first electrode.

In an embodiment, when viewed in a plan view, the first conductive pattern and the second conductive pattern may be substantially disposed in the third conductive pattern.

In an embodiment, a drain or a source of the fifth transistor may be connected to the third conductive pattern through a first contact hole defined through the first insulating layer and the second insulating layer.

In an embodiment, the third conductive pattern may include an electrode portion substantially overlapping the first conductive pattern and a first connection portion extending in the first direction from the electrode portion and overlapping the first contact hole.

In an embodiment, the plurality of insulating layers may further include a third insulating layer disposed on the second insulating layer. The first voltage line may be disposed on the third insulating layer and connected to the third conductive pattern through a second contact hole defined through the third insulating layer.

In an embodiment, the third conductive pattern may include a second connection portion extending in the second direction from the electrode portion and overlapping the second contact hole.

In an embodiment, the display panel may further include a conductive pattern overlapping the semiconductor region of the first transistor and disposed below the semiconductor region of the first transistor. The semiconductor region may contain a metal oxide.

In an embodiment, the conductive pattern may be electrically connected to the third conductive pattern.

In an embodiment, the display panel may further include conductive patterns. Each of the second to fifth transistors may include a drain, a source, a semiconductor region, and a gate. In such an embodiment, the semiconductor region may contain a metal oxide. In such an embodiment, the semiconductor region of each of the second to fifth transistors may overlap a corresponding conductive pattern among the conductive patterns, and the semiconductor region of each of the second to fifth transistors may be disposed on the corresponding conductive pattern among the conductive patterns.

In an embodiment, a gate of each of the second to fifth transistors may be electrically connected to the corresponding conductive pattern.

In an embodiment, the first pixel may further include a third capacitor connected between the first electrode and the second electrode of the light-emitting diode.

In an embodiment, the display panel may further include a fourth voltage line disposed on the second insulating layer and extending in the second direction, where the fourth voltage line receives the first power voltage. In such an embodiment, the second voltage line and the third voltage line may be disposed in a same layer as the fourth voltage line.

In an embodiment, conductive patterns may be further included in the display panel. In such an embodiment, each of the second to fourth voltage lines may overlap a corresponding conductive pattern among the conductive patterns, and the conductive patterns may be disposed below the second to fourth voltage lines.

In an embodiment of the invention, a display device may include a light-emitting diode including a first electrode, a second electrode which receives a first power voltage, and a light-emitting layer disposed between the first electrode and the second electrode, a switching transistor which outputs a voltage corresponding to a data signal from a data line, a first capacitor which stores the voltage received from the switching transistor, a driving transistor which controls an amount of current of the light-emitting diode to correspond to the voltage stored in the first capacitor, and a second capacitor connected between a voltage line, which receives a second power voltage higher than the first power voltage, and an output terminal of the driving transistor.

In an embodiment, a gate of the driving transistor may be disposed below a first insulating layer, a first conductive pattern defining a first electrode of the first capacitor may be disposed below the first insulating layer, a second conductive pattern defining a second electrode of the first capacitor and a first electrode of the second capacitor may be disposed on the first insulating layer, a third conductive pattern defining a second electrode of the second capacitor may be disposed on a second insulating layer covering the second conductive pattern, and the data line may be disposed above the second insulating layer.

In an embodiment, when viewed in a plan view, the first conductive pattern and the second conductive pattern may be substantially disposed inside the third conductive pattern.

In an embodiment, an opening may be defined in the third conductive pattern.

In an embodiment, the display device may further include a third capacitor connected in parallel to the first capacitor. In such an embodiment, the first conductive pattern may define a first electrode of the third capacitor, and a fourth conductive pattern defining a second electrode of the third capacitor may be disposed below the first conductive pattern and overlap the first conductive pattern.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
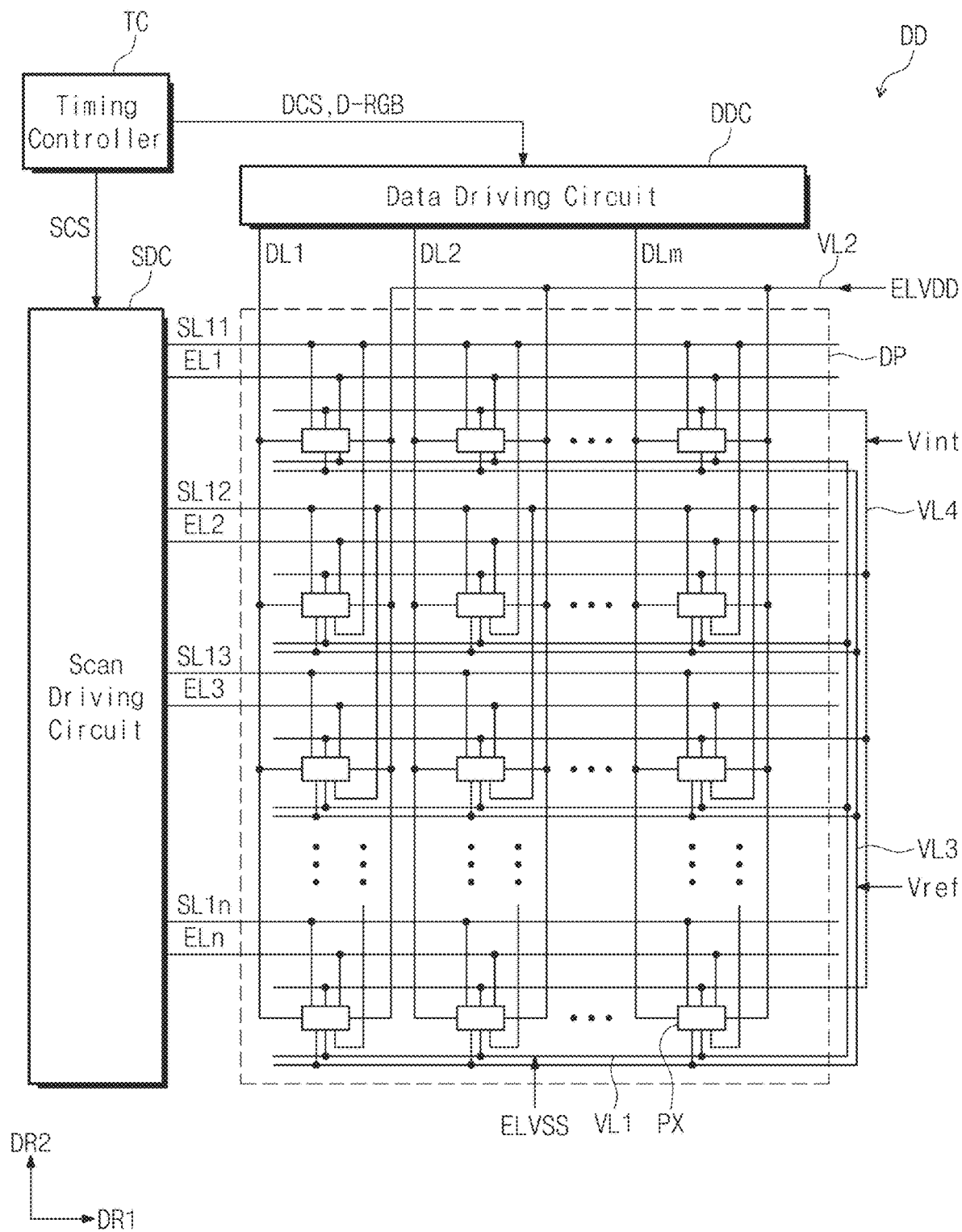
FIG. 1 is a block diagram of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or region, layer, portion, etc.) is referred to as being "on", "connected to" or "coupled to" another element, it can be directly on, connected or coupled to the other element, or intervening elements may be present. In contrast, when an element is referred to as being "directly on" another element, there are no intervening elements present.

Like reference numerals refer to like elements throughout. In addition, in the drawings, the thicknesses, ratios, and dimensions of elements are exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, these elements should not be limited by these terms. These terms are only used to distinguish one element from another element. For example, a first element could be termed a second element without departing from the scope of the invention. Similarly, the second element may also be referred to as the first element. The terms of a singular form include plural forms unless otherwise specified.

Terms, such as "below", "lower", "above", "upper" and the like, are used herein for ease of description to describe one element's relation to another element(s) as illustrated in the figures. The above terms are relative concepts and are described based on the directions indicated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a block diagram of a display device according to an embodiment of the invention. An embodiment of the display device DD includes a timing controller TC, a scan driving circuit SDC, a data driving circuit DDC, and a display panel DP. In such an embodiment, the display panel may be a light-emitting display panel. The light-emitting display panel may include an organic light-emitting display panel or an inorganic light-emitting display panel.

The timing controller TC receives input image signals, converts the data format of the input image signals to meet the interface specification for the scan driving circuit SDC, and generates image data D-RGB. The timing controller TC outputs the image data D-RGB and various control signals DCS and SCS.

The scan driving circuit SDC receives a scan control signal SCS from the timing controller TC. The scan control signal SCS may include a vertical start signal for starting the operation of the scan driving circuit SDC, a clock signal for determining the output timing of signals, and the like. The scan driving circuit SDC generates a plurality of scan signals and sequentially outputs the scan signals to corresponding scan signal lines SL11 to SL1n. In an embodiment, the scan driving circuit SDC generates a plurality of light-emitting control signals in response to the scan control signal SCS and outputs the plurality of light-emitting control signals to corresponding light-emitting signal lines EL1 to ELn.

Although FIG. 1 illustrates an embodiment where a plurality of scan signals and a plurality of light-emitting control signals are output from a single scan driving circuit SDC, the embodiment of the invention is not limited thereto. In an alternative embodiment of the invention, the display device DD may include a plurality of scan driving circuits. In an embodiment of the invention, a driving circuit for generating and outputting a plurality of scan signals and a driving circuit for generating and outputting a plurality of light-emitting control signals may be formed separately from each other.

The data driving circuit DDC receives a data control signal DCS and image data D-RGB from the timing controller TC. The data driving circuit DDC converts the image data D-RGB into data signals and outputs the data signals to a plurality of data lines DL1 to DLm to be described later. The data signals are analog voltages corresponding to the gradation values of the image data D-RGB.

The light-emitting display panel DP may include a plurality of scan line groups. FIG. 1 illustrates an embodiment including the scan signal lines SL11 to SL1n of a first group. The light-emitting display panel DP includes the light-emitting signal lines EL1 to ELn, the data lines DL1 to DLm, a first voltage line VL1, a second voltage line VL2, a third voltage line VL3, a fourth voltage line VL4, and a plurality of pixels PX.

The scan signal lines SL11 to SL1n of the first group may extend in a first direction DR1 and may be arranged in a second direction DR2. The data lines DL1 to DLm may cross the scan signal lines SL11 to SL1n of the first group.

The first voltage line VL1 receives a first power voltage ELVSS. The second voltage line VL2 receives a second power voltage ELVDD. The second power voltage ELVDD has a higher level than the first power voltage ELVSS. The third voltage line VL3 receives a reference voltage Vref (hereinafter, a first voltage). The fourth voltage line VL4 receives an initialization voltage Vint (hereinafter, a second voltage). The first voltage Vref has a lower level than the second power voltage ELVDD. The second voltage Vint has a lower level than the second power voltage ELVDD. In an embodiment, the second voltage Vint may have a lower level than the first voltage Vref and the first power voltage ELVSS.

At least one selected from the first voltage line VL1, the second voltage line VL2, the third voltage line VL3, and the fourth voltage line VL4 may include a line extending in the first direction DR1 or a line extending in the second direction DR2. The line extending in the first direction DR1 and the line extending in the second direction DR2 of the voltage lines may be electrically connected to each other even though the lines are disposed in different layers among a plurality of insulating layers 10 to 40 illustrated in FIG. 4.

An embodiment of the display device DD according to the invention is described above with reference to FIG. 1, but embodiments of the display device DD of the invention are not limited thereto. In an alternative embodiment, signal lines may be further added or omitted depending on the configuration of the pixel driving circuit. In an alternative embodiment, the electrical connection relationship between one pixel PX and the signal lines may be changed.

The plurality of pixels PX may include a plurality of groups that generate different color lights. In one embodiment, for example, the plurality of pixels PX may include red pixels for generating red color light, green pixels for generating green color light, and blue pixels for generating blue color light. The light-emitting diode of the red pixel, the light-emitting diode of the green pixel, and the light-emitting diode of the blue pixel may include light-emitting layers including or made of materials different from each other.

The pixel driving circuit may include a plurality of transistors and at least one capacitor. At least one selected from the scan driving circuit SDC and the data driving circuit DDC may include a plurality of transistors formed through a same process as that of the pixel driving circuit.

The signal lines, the plurality of pixels PX, the scan driving circuit SDC, and the data driving circuit DDC, which are described above, may be provided or formed on a base substrate by performing a photolithography process and an etching process a plurality of times.

A plurality of insulating layers may be provided or formed on the base substrate through a plurality of deposition processes or coating processes. The plurality of insulating layers include an organic layer and/or an inorganic layer. Any one of the plurality of insulating layers may include a plurality of insulating patterns. Each of the plurality of insulating layers overlaps a plurality of pixels PX. Contact holes may be defined or formed in the plurality of insulating layers. The plurality of contact holes may be arranged in each of the plurality of pixels PX based on a predetermined pattern shape or according to a predetermined rule.

Figure 2:
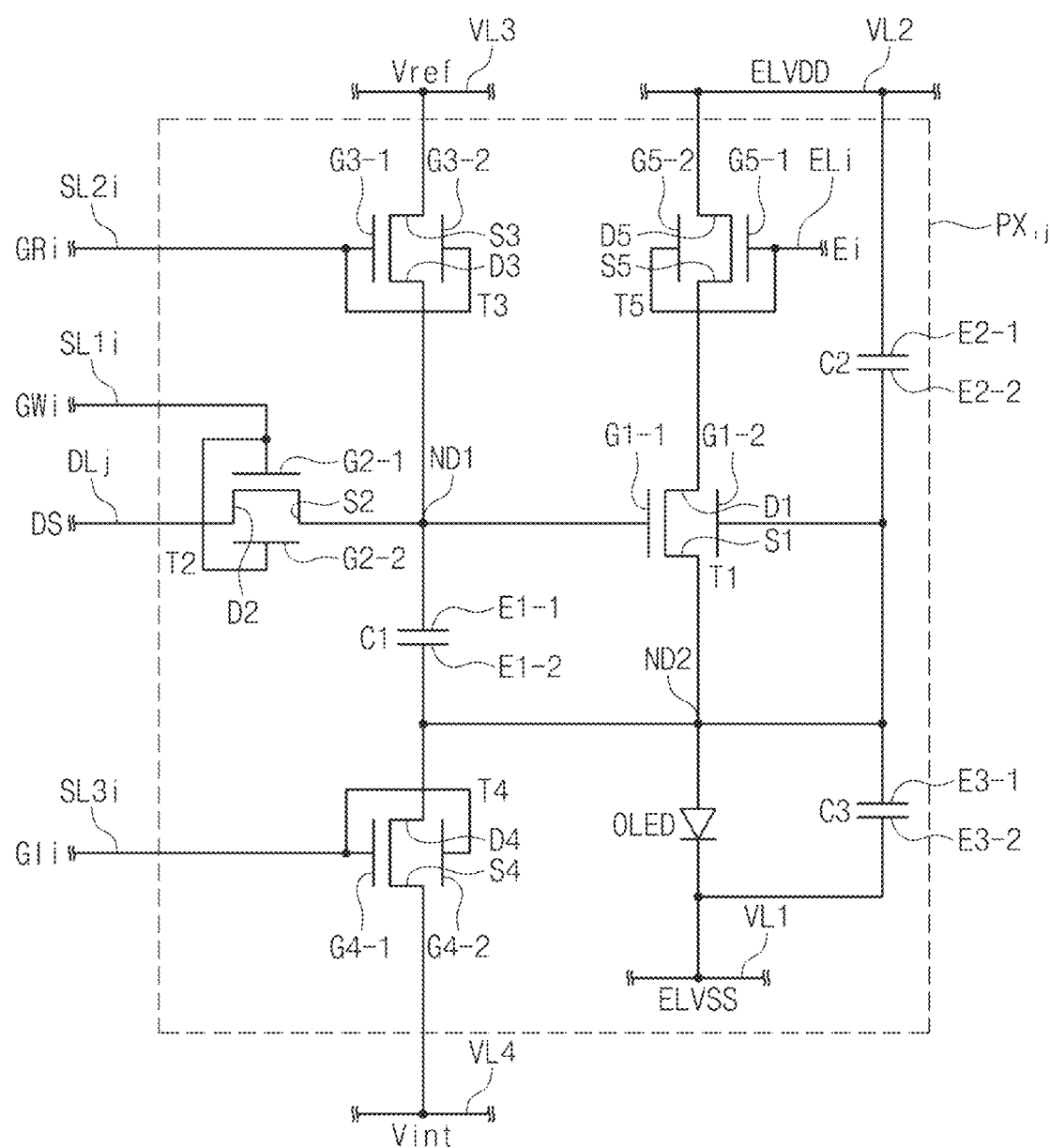
FIG. 2 is an equivalent circuit diagram of a pixel according to an embodiment of the invention.
Figure 3:
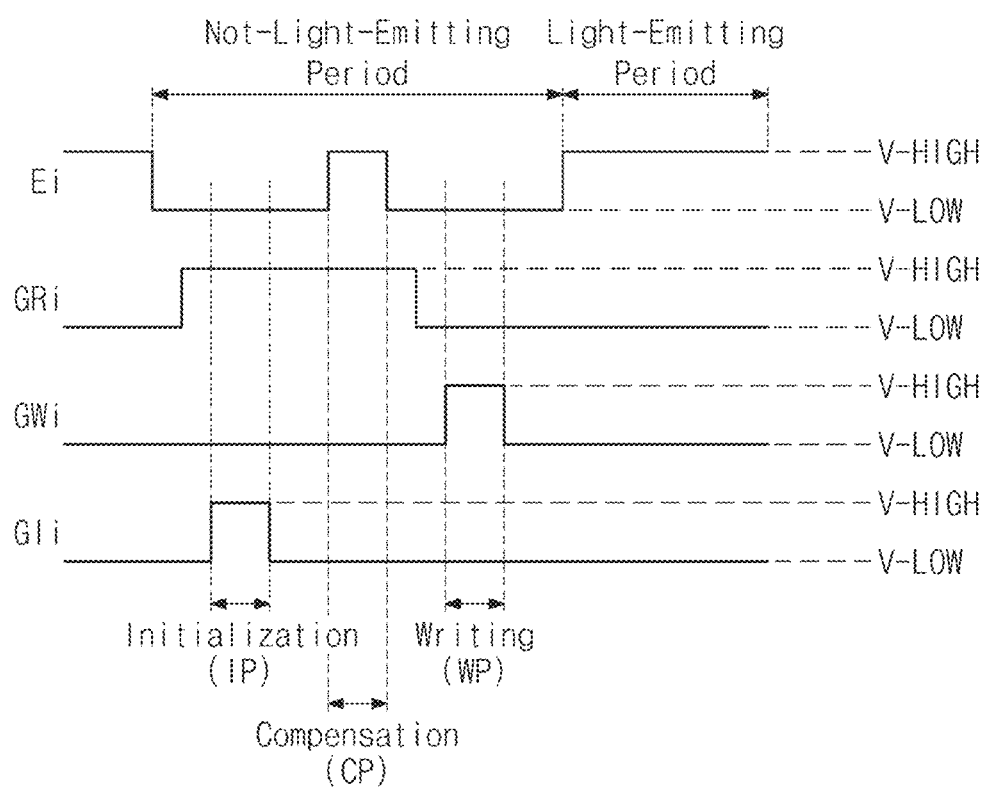
FIG. 3 is a signal timing diagram of driving signals for driving the pixel illustrated in FIG. 2.

FIG. 2 is an equivalent circuit diagram of a pixel according to an embodiment of the invention. FIG. 3 is a signal timing diagram of driving signals for driving the pixel illustrated in FIG. 2.

FIG. 2 illustrates an embodiment of a pixel PXij, which is connected to an i-th scan line SL1i among the scan lines SL11 to SL1n (see FIG. 1) of the first group and to a j-th data line DLj among the plurality of data lines DL1 to DLm (see FIG. 1). The pixel PXij is connected to an i-th scan line SL2i among the scan lines of a second group and the pixel PXij is connected to an i-th scan line SL3i among the scan lines of a third group. Here, n and m are natural numbers, and i and j are natural numbers less than or equal to n and m, respectively.

In an embodiment, the pixel driving circuit may include first to fifth transistors T1 to T5, first to third capacitors C1 to C3, and a light-emitting diode OLED. In such an embodiment, as shown in FIG. 2, the first to fifth transistors T1 to T5 may be an n-type transistor. However, the embodiment of the invention is not limited thereto, and alternatively, at least one of the first to fifth transistors T1 to T5 may be a p-type transistor. In an embodiment of the invention, at least one of the first to fifth transistors T1 to T5 may be omitted, or an additional transistor may be further included in the pixel PXij.

In an embodiment, as shown in FIG. 2, each of the first to fifth transistors T1 to T5 may include two gates or have a double-gate structure, but not being limited thereto. Alternatively, at least one transistor of the first to fifth transistors T1 to T5 may include a single gate. In an embodiment, the upper gates G2-1, G3-1, G4-1, and G5-1 and the lower gates G2-2, G3-2, G4-2, and G5-2 of each of the second to fifth transistors T2 to T5 may be electrically connected to each other, but the embodiment of the invention is not limited thereto. In an alternative embodiment, the lower gates G2-2, G3-2, G4-2, and G5-2 of each of the second to fifth transistors T2 to T5 may be floating electrodes.

In an embodiment, the first transistor T1 may be a driving transistor, and the second transistor T2 may be a switching transistor. A node to which the gate G1-1 of the first transistor T1 is connected may be defined as a first node ND1, and a node to which the source S1 of the first transistor T1 is connected may be defined as a second node ND2.

The light-emitting diode OLED includes a first electrode electrically connected to the first node ND1, a second electrode for receiving the first power voltage ELVSS, and a light-emitting layer disposed between the first electrode and the second electrode. The light-emitting diode OLED will be described later in greater detail.

The first transistor T1 is electrically connected between the second voltage line VL2, which receives the second power voltage ELVDD, and the second node ND2. The first transistor T1 may include a source S1 (hereinafter, a first source) connected to the second node ND2, a drain D1 (hereinafter, a first drain), a semiconductor region, and a gate G1-1 (hereinafter, a first upper gate) electrically connected to the second node ND2. The first transistor T1 may further include a gate G1-2 (hereinafter, a first lower gate) connected to the second node ND2.

The second transistor T2 is electrically connected between the first data line DLj and the first node ND1. The second transistor T2 may include a source S2 (hereinafter, a second source) connected to the first node ND1, a drain D2 (hereinafter, a second drain) connected to the first data line DLj, a semiconductor region, and a gate G2-1 (hereinafter, a second upper gate) connected to the i-th scan line SL1i of the first group. The second transistor T2 may further include a gate G2-2 (hereinafter, a second lower gate) electrically connected to the second upper gate G2-1. The third to fifth transistors T3 to T5, which will be described later, may include the upper gates G3-1, G4-1, and G5-1 and the lower gates G3-2, G4-2, and G5-2 corresponding to the second upper gate G2-1 and the second lower gate G2-2.

The third transistor T3 is electrically connected between the first node ND1 and the third voltage line VL3 that receives the first voltage Vref. The third transistor T3 may include a drain D3 (hereinafter, a third drain) connected to the first node ND1, a source S3 (hereinafter, a third source) connected to the third voltage line VL3, a semiconductor region, and a third upper gate G3-1 connected to the i-th scan line SL2i of the second group.

The fourth transistor T4 is electrically connected between the fourth voltage line VL4, which receives the second voltage Vint, and the second node ND2. The fourth transistor T4 may include a drain D4 (hereinafter, a fourth drain) connected to the second node ND2, a source S4 (hereinafter, a fourth source) connected to the fourth voltage line VL4, a semiconductor region, and a fourth upper gate G4-1 connected to the i-th scan line SL3i of the third group.

The fifth transistor T5 is electrically connected between the second voltage line VL2 and the first drain D1 or the first source S1. In an embodiment, the fifth transistor T5 may include a source S5 (hereinafter, a fifth source) connected to the second voltage line VL2, a drain D5 (hereinafter, a fifth drain) connected to the first drain D1, a semiconductor region, and a fifth upper gate G5-1 connected to an i-th light-emitting signal line ELi.

The first capacitor C1 is electrically connected between the first node ND1 and the second node ND2. The first capacitor C1 includes a first electrode E1-1 connected to the first node ND1 and a second electrode E1-2 connected to the second node ND2. The first capacitor C1 stores the voltage received from the second transistors T2.

The second capacitor C2 is electrically connected between the second voltage line VL2 and the second node ND2. The second capacitor C2 includes a first electrode E2-1 connected to the second voltage line VL2 and a second electrode E2-2 connected to the second node ND2.

The third capacitor C3 is electrically connected between a first electrode and a second electrode of the light-emitting diode OLED. The third capacitor C3 includes a first electrode E3-1 connected to the first electrode of the light-emitting diode OLED and a second electrode E3-2 connected to the second electrode of the light-emitting diode OLED.

The operation of the pixel PXij will be described in detail with reference to FIGS. 2 and 3. The display device DD (see FIG. 1) displays an image during each frame period. The signal lines of each of the scan lines of the first group, the scan lines of the second group, the scan lines of the third group, and the light-emitting signal lines are sequentially scanned during a frame period. FIG. 3 illustrates a part of the frame period.

Referring to FIG. 3, each of signals Ei, GRi, GWi, and GIi may have a high level V-HIGH during a partial period and a low level V-LOW during a partial period. The above-described n-type first to fifth transistors T1 to T5 are turned on when a corresponding control signal has a high level V-HIGH.

During an initialization period IP, the third transistor T3 and the fourth transistor T4 are turned on. The first node ND1 is initialized to the first voltage Vref. The second node ND2 is initialized to the second voltage Vint. The first capacitor C1 is initialized to a difference value between the first voltage Vref and the second voltage Vint. The second capacitor C2 is initialized to a difference value between the second power voltage ELVDD and the second voltage Vint. The third capacitor C3 is initialized to a difference value between the first power voltage ELVSS and the second voltage Vint.

During a compensation period CP, the third transistor T3 and the fifth transistor T5 are turned on. A voltage corresponding to the threshold voltage of the first transistor T1 is compensated for in the first capacitor C1.

During a writing period WP, the second transistor T2 is turned on. The second transistor T2 outputs a voltage corresponding to a data signal DS. As a result, the voltage value corresponding to the data signal DS is charged in the first capacitor C1. The data signal DS for which the threshold voltage of the first transistor T1 is compensated is charged in the first capacitor C1. The threshold voltages of the driving transistors may be different for each of the pixels PX (see FIG. 1), and the pixel PXij illustrated in FIGS. 2 and 3 may supply the light-emitting diode OLED with a current having a magnitude proportional to the data signal DS regardless of a deviation of the threshold voltages of the driving transistors.

Thereafter, during a light-emitting period, the fifth transistor T5 is turned on. The first transistor T1 provides the light-emitting diode OLED with a current corresponding to a voltage value stored in the first capacitor C1. The light-emitting diode OLED may emit light with a luminance corresponding to the data signal DS.

Figure 4:
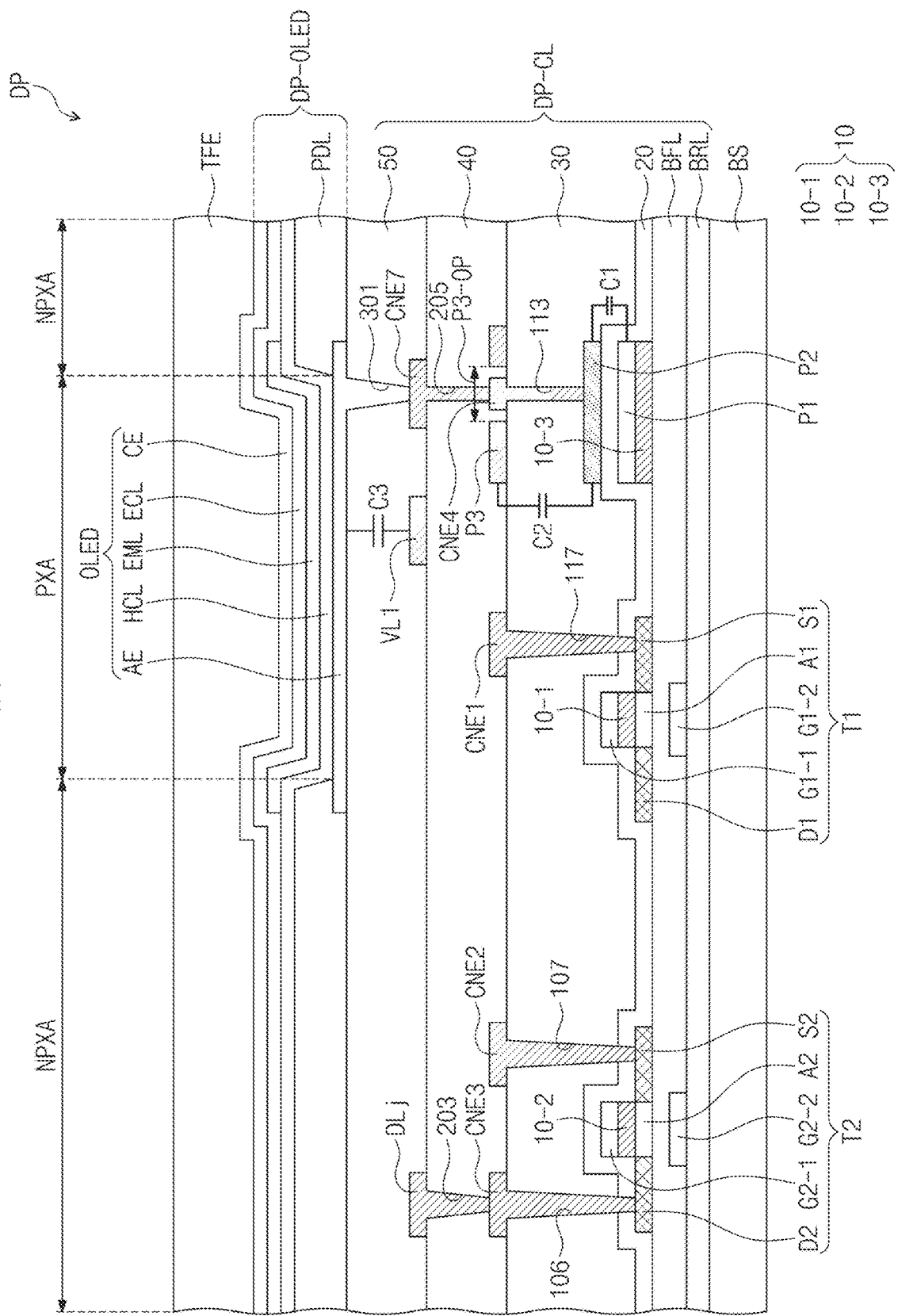
FIG. 4 is a cross-sectional view of a display panel corresponding to a pixel according to an embodiment of the invention.

FIG. 4 is a cross-sectional view of a display panel according to an embodiment of the invention. FIG. 4 is a cross-sectional view of a portion corresponding to some configuration of the pixel PXij illustrated in FIG. 2.

Referring to FIG. 4, an embodiment of the display panel DP may include a base layer BS, a circuit element layer DP-CL disposed on the base layer BS, a display element layer DP-OLED, and a thin-film encapsulation layer TFE. The display panel DP may further include functional layers such as an anti-reflection layer or a refractive index control layer. The circuit element layer DP-CL includes a plurality of insulating layers and a circuit element. The insulating layers described below may include an organic layer and/or an inorganic layer.

An insulating layer, a semiconductor layer, and a conductive layer are formed through processes such as coating and deposition. Thereafter, the insulating layer, the semiconductor layer, and the conductive layer may be selectively patterned through photolithography and etching processes. Through these processes, a semiconductor pattern, a conductive pattern, a signal line, and the like are formed. Patterns disposed in a same layer are formed through a same process.

The base layer BS may include a synthetic resin film. The synthetic resin layer may include a thermosetting resin. In an embodiment, the synthetic resin layer may be a polyimide-based resin layer, and the material thereof is not particularly limited. The synthetic resin layer may include at least one selected from acrylic-based resin, methacrylic-based resin, polyisoprene-based resin, vinyl-based resin, epoxy-based resin, urethane-based resin, cellulose-based resin, siloxane-based resin, polyamide-based resin, and perylene-based resin. In an embodiment, the base layer may include a glass substrate, a metal substrate, an organic/inorganic composite material substrate, or the like.

An inorganic layer is disposed or formed on the upper surface of the base layer BS. The inorganic layer may include at least one selected from aluminum oxide, titanium oxide, silicon oxide, silicon nitride, silicon oxynitride, zirconium oxide, and hafnium oxide. The inorganic layer may be formed in multiple layers. The multi-layered inorganic layers may constitute a barrier layer BRL and/or a buffer layer BFL, which will be described later. The barrier layer BRL and the buffer layer BFL may be selectively provided or omitted.

The barrier layer BRL prevents foreign substances from being introduced from the outside. The barrier layer BRL may include a silicon oxide layer and a silicon nitride layer. Each of the silicon oxide layer and the silicon nitride layer may be provided in plurality, and the silicon oxide layers and the silicon nitride layers may be alternately stacked one on another.

A conductive layer (hereinafter, a first conductive layer) is disposed on the barrier layer BRL. The first conductive layer may include a plurality of conductive patterns. FIG. 4 illustrates a partial pattern of the first conductive layer. The first lower gate G1-2 and the second lower gate G2-2 are defined by portions of the conductive pattern of the first conductive layer.

The buffer layer BFL may be disposed on the barrier layer BRL to cover the first lower gate G1-2 and the second lower gate G2-2. The buffer layer BFL improves the bonding strength between the base layer BS and the semiconductor pattern and/or the conductive pattern. The buffer layer BFL may include a silicon oxide layer and a silicon nitride layer. The silicon oxide layer and the silicon nitride layer may be alternately stacked one on another.

A semiconductor layer is disposed on the buffer layer BFL. The semiconductor layer may include a plurality of semiconductor patterns. The semiconductor pattern may include a metal oxide. The metal oxide semiconductor may include a crystalline or amorphous oxide semiconductor. In one embodiment, for example, the oxide semiconductor may include a metal oxide containing zinc (Zn), indium (In), gallium (Ga), tin (Sn), titanium (Ti), or the like, or a mixture of a metal such as zinc (Zn), indium (In), gallium (Ga), tin (Sn), or titanium (Ti), and an oxide thereof. Oxide semiconductors may include an indium-tin oxide ("ITO"), an indium-gallium-zinc oxide ("IGZO"), a zinc oxide (ZnO), an indium-zinc oxide (IZnO), a zinc-indium oxide ("ZIO"), an indium oxide (InO), a titanium oxide (TiO), an indium-zinc-tin oxide ("IZTO"), a zinc-tin oxide ("ZTO"), and the like.

The semiconductor pattern may include a plurality of regions divided according to whether or not a metal oxide is reduced. A region (hereinafter, a reduced region) in which the metal oxide is reduced has greater conductivity than a region (hereinafter, a non-reduced region) in which the metal oxide is not reduced. The reduced region substantially serves as a source/drain or signal line of a transistor. The non-reduced region substantially corresponds to a semiconductor region (or channel) of the transistor. In such an embodiment, a portion of the semiconductor pattern may be a semiconductor region of the transistor, another portion thereof may be a source/drain of the transistor, and another portion thereof may be a signal transmission region.

In an embodiment, as illustrated in FIG. 4A, the source S1, the semiconductor region A1, and the drain D1 of the first transistor T1 are formed from (or defined by portions of) the semiconductor pattern. The source S1 and the drain D1 of the first transistor T1 extend in opposite directions to each other from the semiconductor region A1. The source S2, the semiconductor region A2, and the drain D2 of the second transistor T2 are also formed from the semiconductor pattern.

The first lower gate G1-2 and the second lower gate G2-2 described above have a function as a light-blocking pattern. The first lower gate G1-2 and the second lower gate G2-2 are respectively disposed below the semiconductor region A1 of the first transistor T1 and the semiconductor region A2 of the second transistor T2 to block light incident thereon from the outside. The light-blocking pattern prevents external light from changing the voltage-current characteristics of each of the first and second transistors T1 and T2.

A first insulating layer 10 is disposed on the buffer layer BFL. In an embodiment, the first insulating layer 10 is not formed in the entire display panel DP, but overlaps only a specific conductive pattern to be described later. The first insulating layer 10 includes a plurality of insulating patterns. FIG. 4 illustrates an embodiment where the first insulating layer 10 includes a first insulating pattern 10-1, a second insulating pattern 10-2, and a third insulating pattern 10-3.

The first insulating pattern 10-1 and the second insulating pattern 10-2 respectively overlap a first upper gate G1-1 and a second upper gate G2-1 to be described later. The third insulating pattern 10-3 overlaps a first conductive pattern P1 to be described later.

A conductive layer (hereinafter, a second conductive layer) is disposed on the first insulating layer 10. The second conductive layer may include a plurality of conductive patterns respectively overlapping the insulating patterns of the first insulating layer 10. In an embodiment, as shown in FIG. 4, the first upper gate G1-1, the second upper gate G2-1, and the first conductive pattern P1 may be defined by portions of the conductive pattern of the second conductive layer. Since the second conductive layer and the first insulating layer are etched through a same process, the conductive pattern of the second conductive layer and the insulating pattern of the first insulating layer have substantially a same shape as each other.

The first conductive pattern P1 defines the first electrode E1-1 of the first capacitor C1 illustrated in FIG. 2. On a cross section, the first conductive pattern P1 may be spaced apart from the upper gate G1-1 of the first transistor T1, but the first conductive pattern P1 may have an integral shape with the upper gate G1-1 of the first transistor T1. In such an embodiment, a first portion of any one conductive pattern may correspond to the upper gate G1-1 of the first transistor T1, and a second portion thereof may correspond to the first conductive pattern P1, as shown in FIG. 6C.

A second insulating layer 20 covering the first upper gate G1-1, the second upper gate G2-1, and the first conductive pattern P1 is disposed on the buffer layer BFL. The second insulating layer 20 may be an inorganic layer and/or an organic layer, and may have a single-layered or multi-layered structure.

A second conductive pattern P2 overlapping the first conductive pattern P1 may be disposed on the second insulating layer 20. The second conductive pattern P2 defines the second electrode E1-2 of the first capacitor C1 and the second electrode E2-2 of the second capacitor C2 which are illustrated in FIG. 2.

A third insulating layer 30 covering the second conductive pattern P2 is disposed on the second insulating layer 20. In an embodiment, the third insulating layer 30 may be an organic layer and may have a single-layered structure, but the embodiment of the invention is not particularly limited thereto.

A conductive layer (hereinafter, a third conductive layer) is disposed on the third insulating layer 30. The third conductive layer may include a plurality of conductive patterns. In an embodiment, the third conductive layer includes a third conductive pattern P3 defining the first electrode E2-1 of the second capacitor C2 as illustrated in FIG. 2. The third conductive pattern P3 may have an opening P3-OP defined therein. Here, the phrase "an element has an opening" may mean that the opening is defined or formed through the element.

The third conductive layer may further include a plurality of connection electrodes. FIG. 4 illustrates an embodiment where the third conductive layer includes first to fourth connection electrodes CNE1 to CNE4. In such an embodiment, the first connection electrode CNE1 is connected to the first source S1 through a contact hole 117 defined through the second and third insulating layers 20 and 30, the second connection electrode CNE2 is connected to the second source S2 through a contact hole 107 defined through the second and third insulating layers 20 and 30, and the third connection electrode CNE3 is connected to the second drain D2 through a contact hole 106 defined through the second and third insulating layers 20 and 30.

The fourth connection electrode CNE4 is connected to the second conductive pattern P2 through a contact hole 113 defined through the third insulating layer 30. The fourth connection electrode CNE4 is disposed inside the opening P3-OP. The fourth connection electrode CNE4 electrically connects the second conductive pattern P2 to a first electrode AE disposed thereabove.

A fourth insulating layer 40 covering the third conductive layer is disposed on the third insulating layer 30. In an embodiment, the fourth insulating layer 40 may be an organic layer and may have a single-layered structure, but the embodiment of the invention is not particularly limited.

A conductive layer (hereinafter, a fourth conductive layer) is disposed on the fourth insulating layer 40. The fourth conductive layer may include a plurality of conductive patterns. The fourth conductive layer includes a seventh connection electrode CNE7. The seventh connection electrode CNE7 is connected to the fourth connection electrode CNE4 through a contact hole 205 defined through the fourth insulating layer 40.

The fourth conductive layer may further include a data line DLj and a first voltage line VL1. The data line DLj is connected to the third connection electrode CNE3 through a contact hole 203 defined through the fourth insulating layer 40. A portion of the first voltage line VL1 overlapping the first electrode AE of the light-emitting diode OLED, which will be described later, defines the second electrode E3-2 of the third capacitor C3 illustrated in FIG. 2. A portion of the first electrode AE of the light-emitting diode OLED defines the first electrode E3-1 of the third capacitor C3 illustrated in FIG. 2.

A fifth insulating layer 50 covering the fourth conductive layer is disposed on the fourth insulating layer 40. In an embodiment, the fifth insulating layer 50 may be an organic layer and may have a single-layered structure, but the embodiment of the invention is not particularly limited.

The first electrode AE of the light-emitting diode OLED is disposed on the fifth insulating layer 50. The first electrode AE may be an anode. A pixel-defining film PDL is disposed on the fifth insulating layer 50. The first electrode AE is connected to the seventh connection electrode CNE7 through a contact hole 301 defined through the fifth insulating layer 50.

An opening OP is defined through the pixel-defining film PDL to expose at least a portion of the first electrode AE. The opening OP of the pixel-defining film PDL may define a light-emitting region PXA. In one embodiment, for example, the plurality of pixels PX (see FIG. 1) may be disposed on a plane of the display panel DP (see FIG. 1) in a predetermined pattern shape or according to a certain rule. A region in which the plurality of pixels PX are disposed may be defined as a pixel region, and one pixel region may include a light-emitting region PXA and a non-light-emitting region NPXA adjacent to the light-emitting region PXA. The non-light-emitting region NPXA may surround the light-emitting region PXA.

A hole control layer HCL may be commonly disposed in the light-emitting region PXA and the non-light-emitting region NPXA. A common layer such as the hole control layer HCL may be commonly formed in the plurality of pixels PX. The hole control layer HCL may include a hole transport layer and a hole injection layer.

A light-emitting layer EML is disposed on the hole control layer HCL. The light-emitting layer EML may be disposed only in a region corresponding to an opening OP. The light-emitting layer EML may be separately formed in each of the plurality of pixels PX.

In an embodiment, the light-emitting layer EML may be a patterned light-emitting layer as shown in FIG. 4, but not being limited thereto. In an alternative embodiment, the light-emitting layer EML may be commonly disposed in the plurality of pixels PX. In such an embodiment, the commonly disposed light-emitting layer EML may generate white light or blue light. In an embodiment, the light-emitting layer EML may have a multi-layered structure.

An electron control layer ECL is disposed on the light-emitting layer EML. The electron control layer ECL may include an electron transport layer and an electron injection layer. A second electrode CE is disposed on the electron control layer ECL. The electron control layer ECL and the second electrode CE are commonly disposed in the plurality of pixels PX.

A thin-film encapsulation layer TFE is disposed on the second electrode CE. The thin-film encapsulation layer TFE is commonly disposed in the plurality of pixels PX. In an embodiment, the thin-film encapsulation layer TFE directly covers the second electrode CE. In an embodiment of the invention, a capping layer directly covering the second electrode CE may be further disposed. In an embodiment of the invention, the stacked structure of the light-emitting diode OLED may have a structure turned upside down from the structure illustrated in FIG. 4.

The thin-film encapsulation layer TFE includes an inorganic layer or an organic layer. In an embodiment of the invention, the thin-film encapsulation layer TFE may include two inorganic layers and an organic layer interposed therebetween. In an embodiment of the invention, the thin-film encapsulation layer may include a plurality of inorganic layers and a plurality of organic layers which are alternately stacked one on another.

Figure 5:
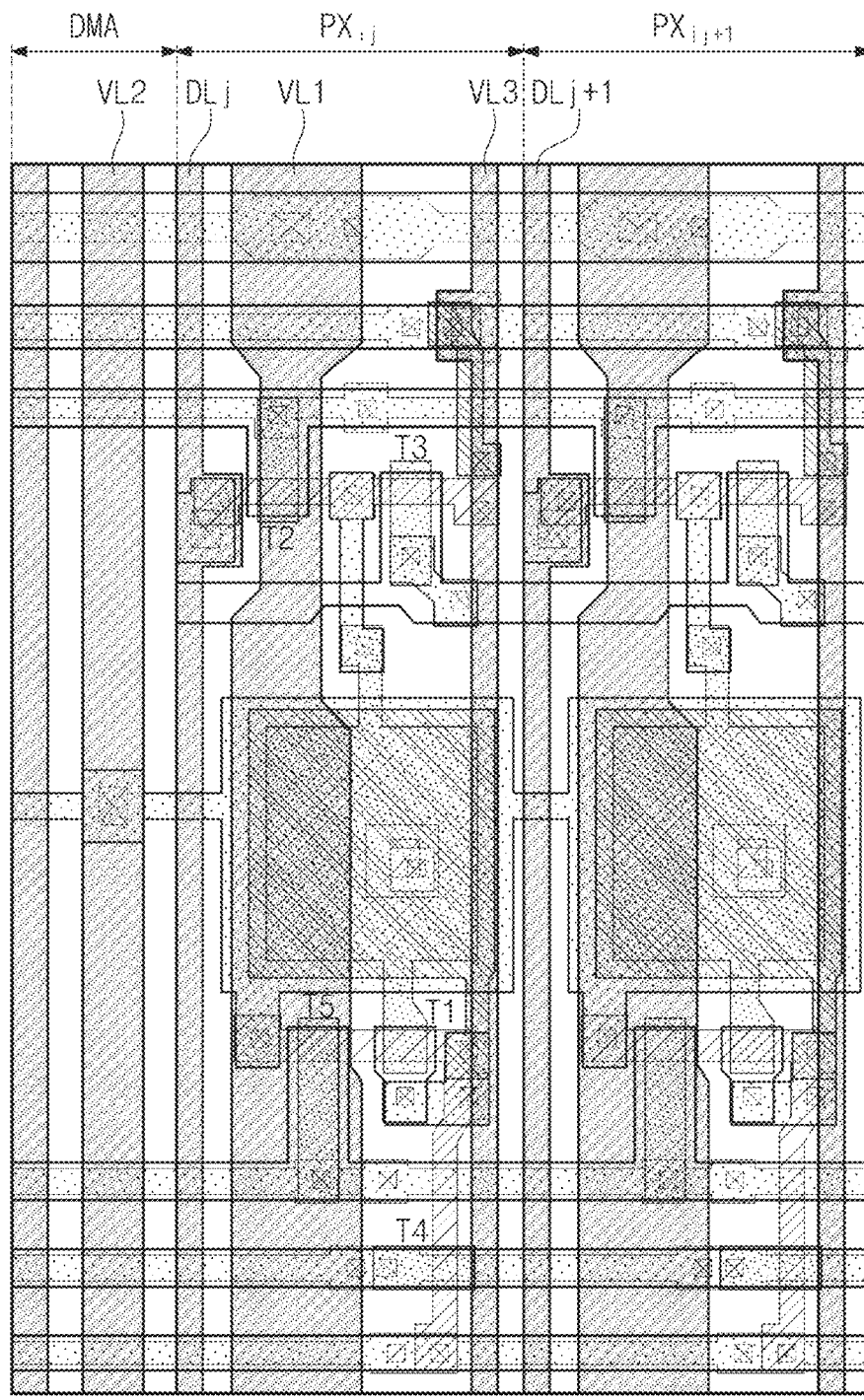
FIG. 5 is a plan view of pixels according to an embodiment of the invention.

FIG. 5 is a plan view of pixels PXij and PXij+1 according to an embodiment of the invention. FIG. 6A to 6H are plan views in accordance with a stacking order of patterns of the pixels PXij and PXij+1 according to an embodiment of the invention. The same or like elements shown in FIGS. 5 to 6H have been labeled with the same reference characters as used above to describe those with reference to FIGS. 1 to 4, and any repetitive detailed description thereof will hereinafter be omitted or simplified.

FIG. 5 illustrates a region corresponding to two pixels PXij and PXij+1 disposed in a same row and one dummy region DMA adjacent thereto. Dummy regions DMA may be disposed on one side and/or the other side of a pixel row, or may be disposed at regular intervals with a plurality of pixels interposed therebetween in the pixel row.

Figure 6A:
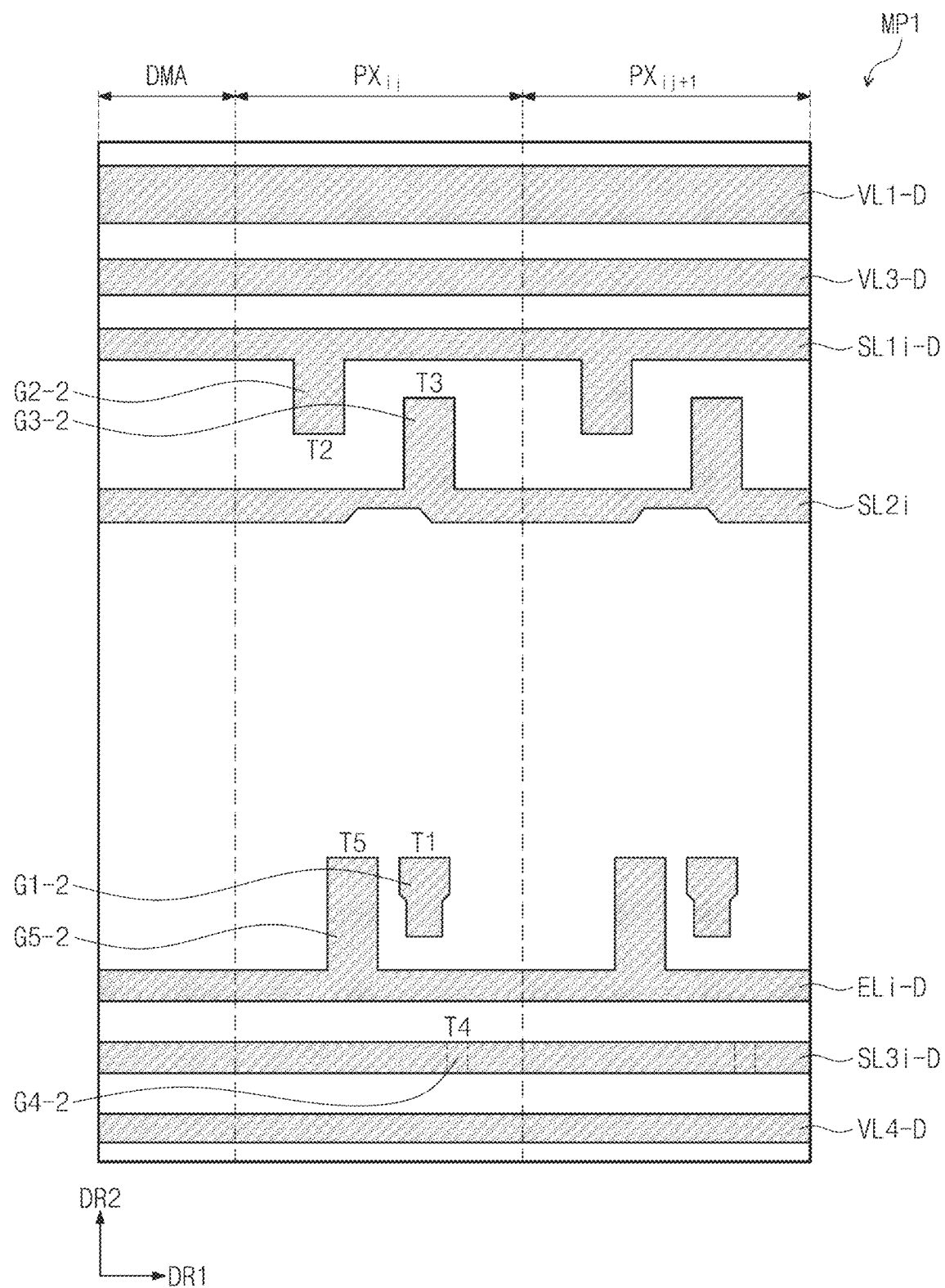
FIGS. 6A to 6H are plan views in accordance with a stacking order of patterns included in pixels according to an embodiment of the invention.

Referring to FIGS. 5 and 6A, the conductive patterns of a first conductive layer MP1 are disposed on the base layer BS (see FIG. 4). The conductive pattern of the first conductive layer MP1 may include a first dummy voltage line VL1-D, a third dummy voltage line VL3-D, a fourth dummy voltage line VL4-D, a dummy scan line SL1$i$-D of a first group, a dummy scan line SL3$i$-D of a third group, and a light-emitting dummy signal line ELi-D. The first dummy voltage line VL1-D, the third dummy voltage line VL3-D, the fourth dummy voltage line VL4-D, the dummy scan line SL1$i$-D of the first group, the dummy scan line SL3$i$-D of the third group, and the light-emitting dummy signal line ELi-D may respectively overlap a second voltage line VL2, a third voltage line VL3, a fourth voltage line VL4, an i-th scan line SL1$i$ of the first group, an i-th scan line SL3$i$ of the third group, and an i-th light-emitting signal line Eli.

The conductive pattern of the first conductive layer MP1 may further include the lower gates G1-2, G2-2, G3-2 and G5-2 of the first, second, third, and fifth transistors T1, T2, T3, and T5. The lower gate G4-2 of the fourth transistor T4 corresponds to a portion of the dummy scan line SL3$i$-D of the third group.

The conductive pattern of the first conductive layer MP1 includes an i-th scan line SL2$i$ of the second group. The lower gate G3-2 of the third transistor T3 extends from the i-th scan line SL2$i$ of the second group.

Figure 6B:
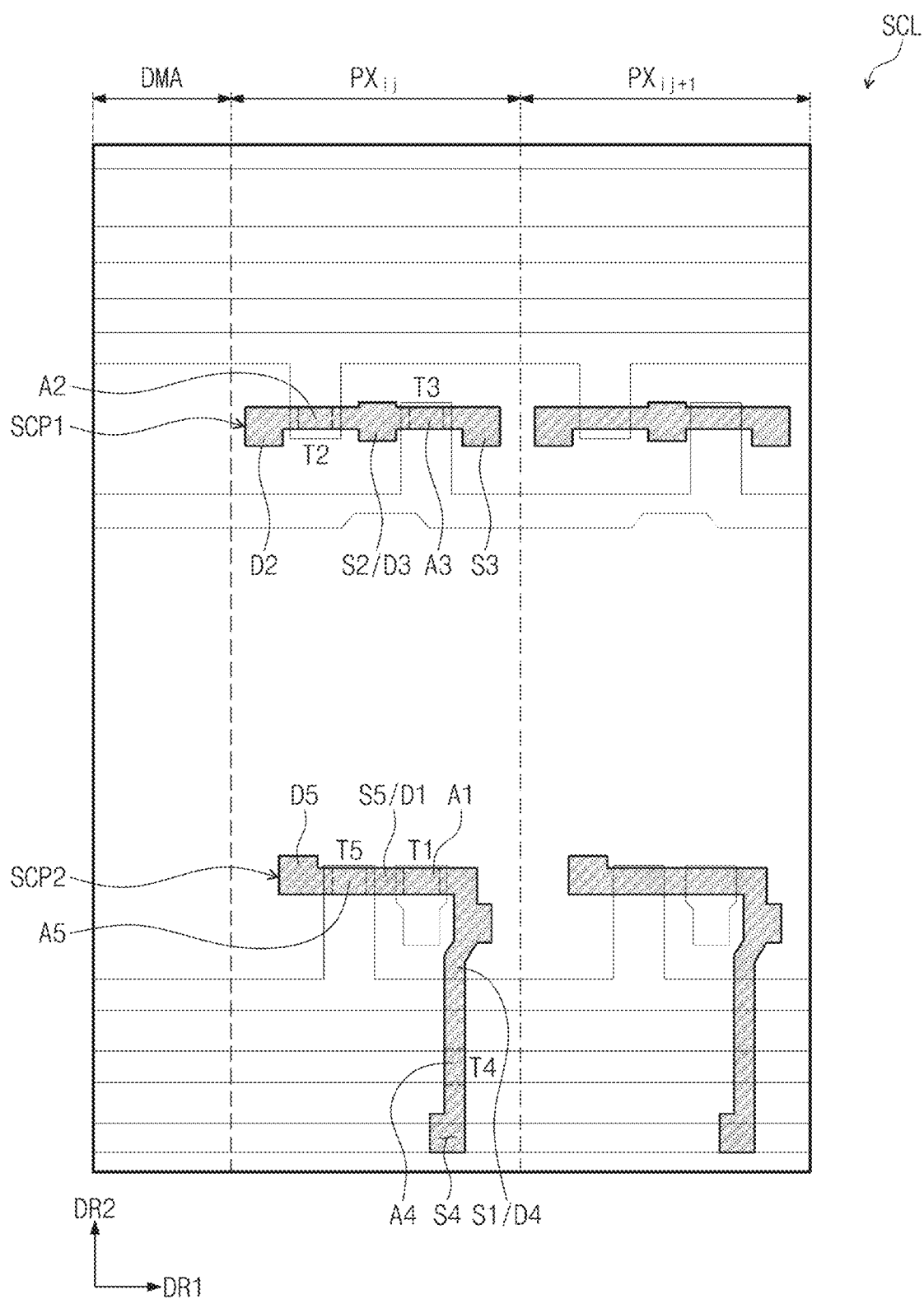
Figure 6C:
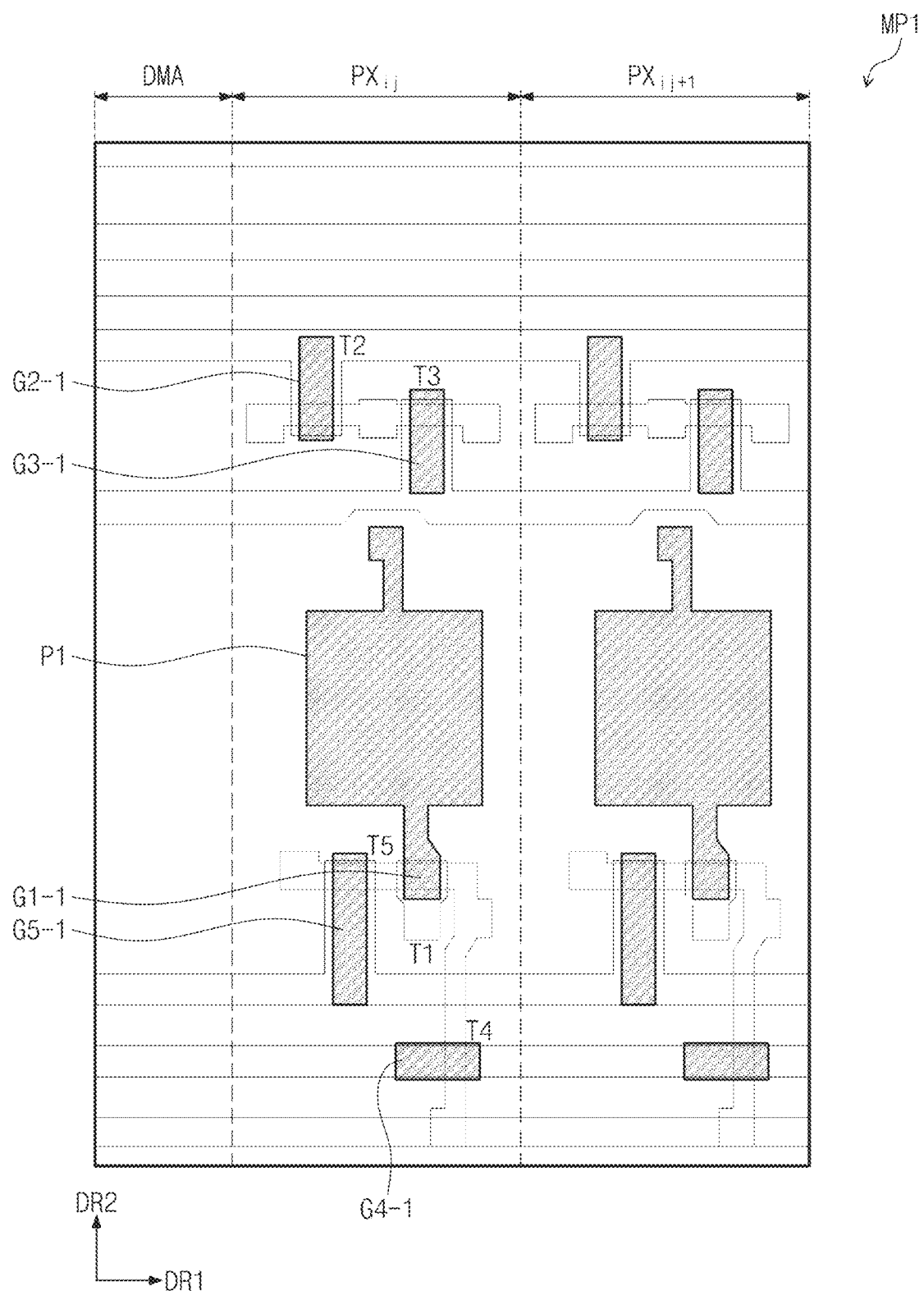

Referring to FIGS. 5 and 6B, the semiconductor patterns of the semiconductor layer SCL are disposed on the buffer layer BFL (see FIG. 4). A first semiconductor pattern SCP1 and a second semiconductor pattern SCP2 may be disposed to correspond to the pixel PXij.

The first semiconductor pattern SCP1 may include the sources S2 and S3, semiconductor regions A2 and A3, and drains D2 and D3 of the second and third transistors T2 and T3. The second semiconductor pattern SCP2 may include the sources S1, S4, and S5, semiconductor regions A1, A4, and A5, and drains D1, D4, and D5 of the first, fourth, and fifth transistors T1, T4, and T5.

The sources/drains/semiconductor regions of the first semiconductor pattern SCP1 and the second semiconductor pattern SCP2 illustrated in FIG. 6B are not distinguished from each other. After a reduction process is performed by using, as masks, the upper gates G1-1, G2-1, G3-1, G4-1, and G5-1 to be described with reference to FIG. 6C, the sources/drains/semiconductor regions are distinguished from each other.

Referring to FIGS. 5 and 6C, the conductive patterns of the first conductive layer MP1 are disposed on the first insulating layer 10 (see FIG. 4). The conductive patterns of the first conductive layer MP1 may include the upper gates G1-1, G2-1, G3-1, G4-1, and G5-1 of the first, second, third, fourth, and fifth transistors T1 to T5. When a reduction process is performed by using, as masks, the upper gates G1-1, G2-1, G3-1, G4-1, and G5-1, the source/drain of each of the first semiconductor pattern SCP1 and the second semiconductor pattern SCP2 have a greater conductivity than the semiconductor region. Through the reduction process, the first, second, third, fourth, and fifth transistors T1 to T5 having a switch function are provided.

The conductive patterns of the first conductive layer MP1 may include a first conductive pattern P1. The first conductive pattern P1 may have an integral shape with the upper gate G1-1 of the first transistor T1.

Figure 6D:
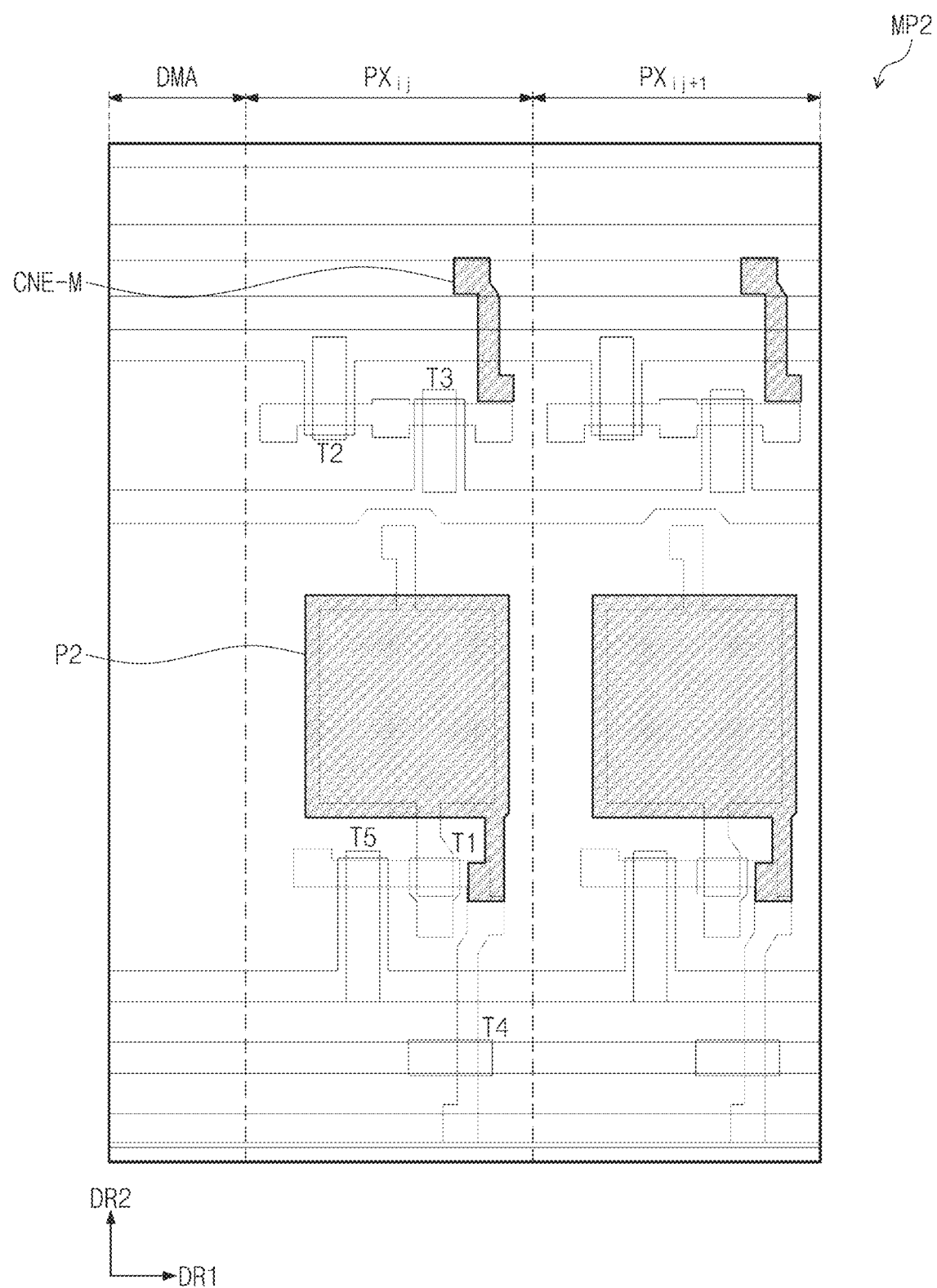

Referring to FIGS. 5 and 6D, the conductive patterns of a second conductive layer MP2 are disposed on the second insulating layer 20 (see FIG. 4). The conductive patterns of the second conductive layer MP2 may include a second conductive pattern P2 and an intermediate connection pattern CNE-M.

Figure 6E:
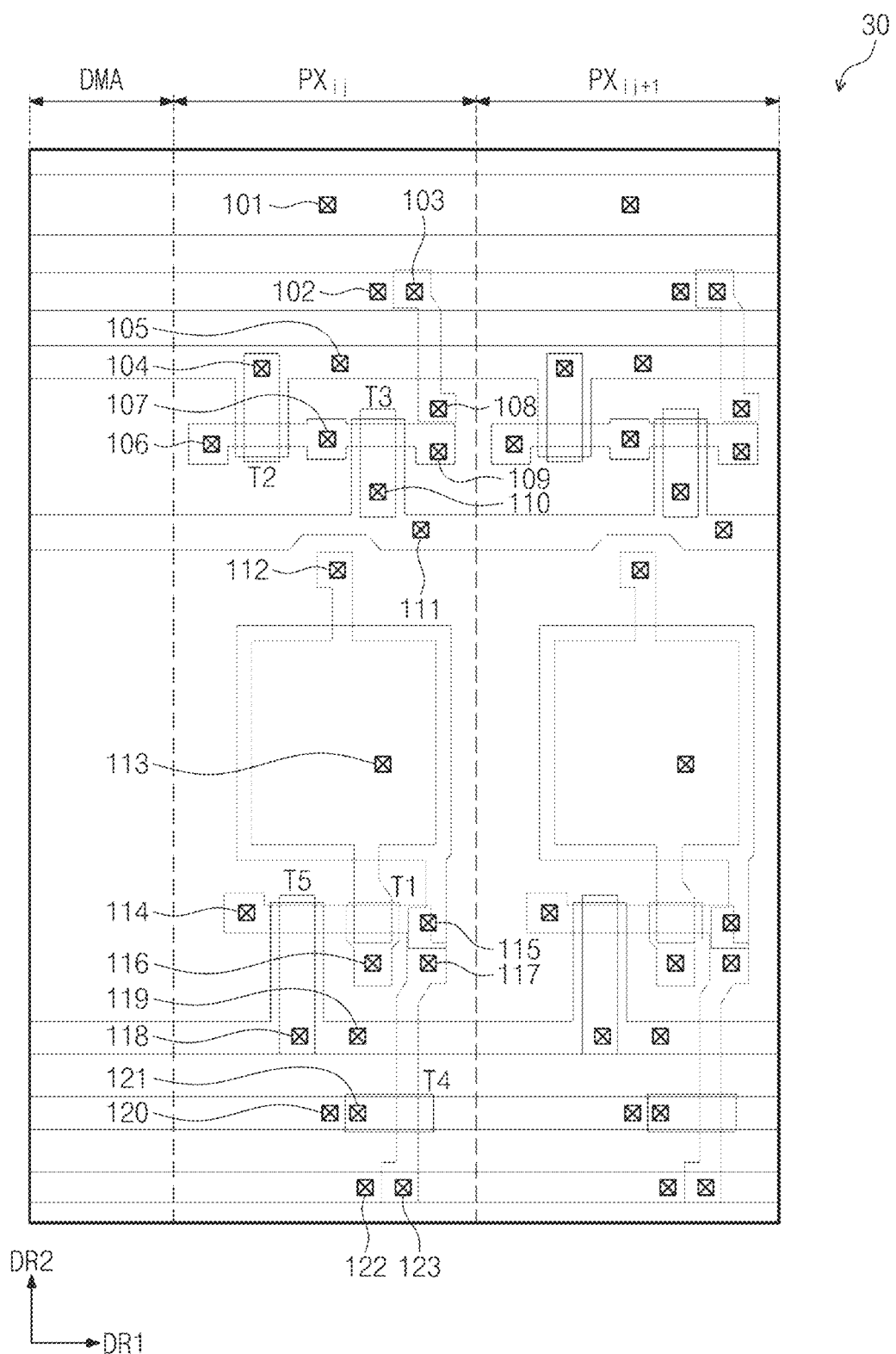

Referring to FIGS. 5 and 6E, the third insulating layer 30 is disposed on the second insulating layer 20 (see FIG. 4). FIG. 6E illustrates a plurality of contact holes 101 to 123 defined in the third insulating layer 30. Some of the plurality of contact holes 101 to 123 may be formed or defined through both the second insulating layer 20 and the third insulating layer 30, and others thereof may pass through only the third insulating layer 30. The conductive patterns described with reference to FIGS. 6A to 6D and the conductive patterns illustrated in FIG. 6F to be described later are electrically connected to each other through the contact holes 101 to 123 to form the equivalent circuit of FIG. 2.

Figure 6F:
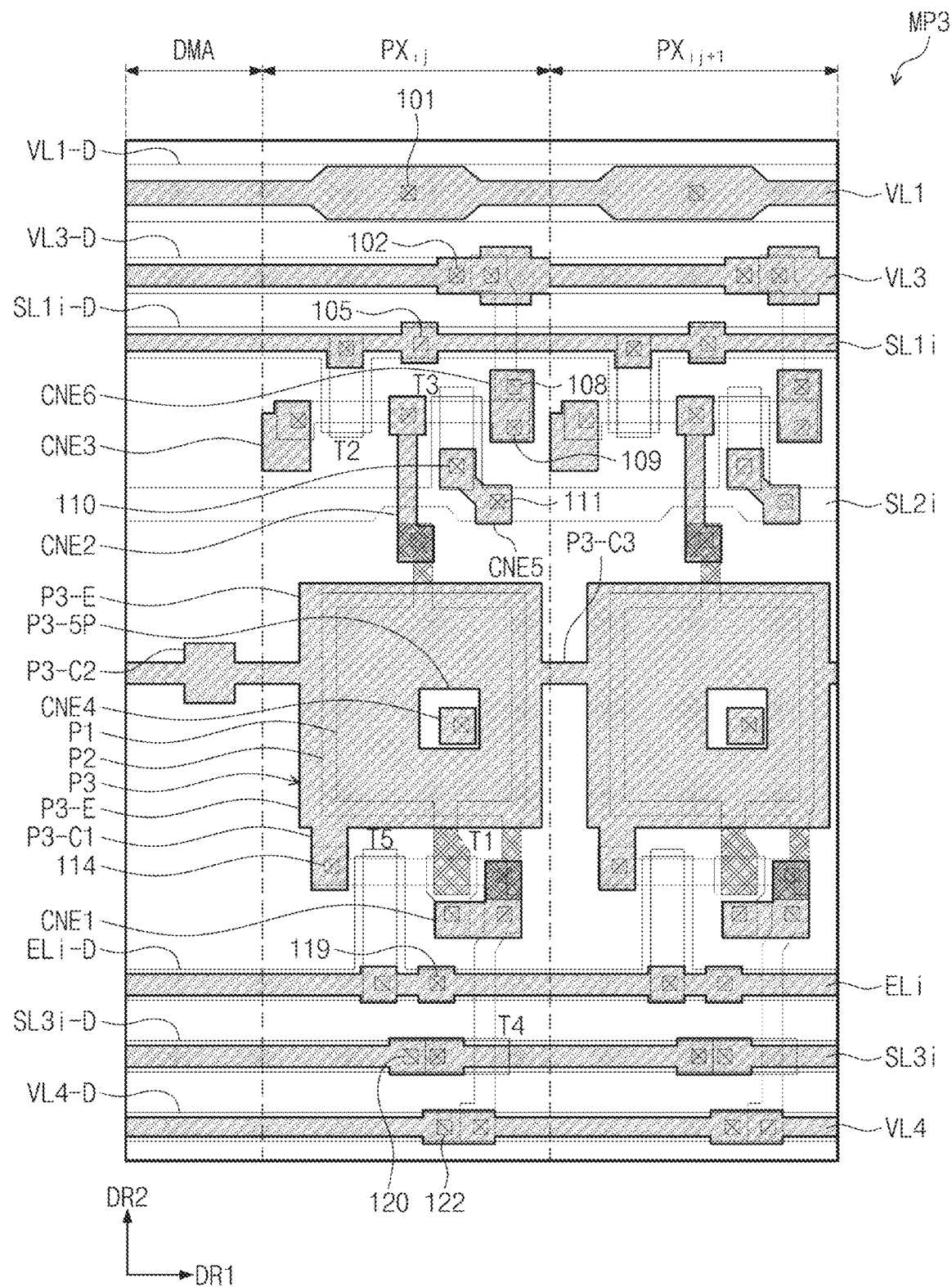

Referring to FIGS. 5 and 6F, the conductive patterns of a third conductive layer MP3 are disposed on the third insulating layer 30 (see FIG. 4). The third conductive layer MP3 may include a first voltage line VL1, a third voltage line VL3, a fourth voltage line VL4, an i-th scan line SL1i of the first group, an i-th scan line SL3i of the third group, and an i-th light-emitting signal line ELi.

The first voltage line VL1 may be connected to the first dummy voltage line VL1-D through the contact hole 101. The third voltage line VL3 may be connected to the third dummy voltage line VL3-D through the contact hole 102. The fourth voltage line VL4 may be connected to the fourth dummy voltage line VL4-D through the contact hole 122.

The i-th scan line SL1i of the first group may be connected to the dummy scan line SL1i-D of the first group through the contact hole 105. The i-th scan line SL3i of the third group may be connected to the dummy scan line SL3i-D of the third group through the contact hole 120. The i-th light-emitting signal line ELi may be connected to the light-emitting dummy signal line ELi-D through the contact hole 119.

The third conductive layer MP3 may further include first to sixth connection electrodes CNE1, CNE2, CNE3, CNE4, CNE5, and CNE6. The fifth connection electrode CNE5 connects the i-th scan line SL2i of the second group to the upper gate G3-1 of the third transistor T3 through the contact holes 110 and 111. The sixth connection electrode CNE6 connects the intermediate connection pattern CNE-M to the source S3 of the third transistor T3 through the contact holes 108 and 109.

The third conductive layer MP3 may include a third conductive pattern P3. The third conductive pattern P3 includes an electrode portion P3-E overlapping the second conductive pattern P2. A partial region of the third conductive pattern P3, that is, the electrode portion P3-E, is disposed between a j-th data line DLj and a j+1-th data line DLj+1, which will be described later.

When viewed in a plan view, the first conductive pattern P1 and the second conductive pattern P2 are substantially disposed inside the third conductive pattern P3. The first conductive pattern P1 and the second conductive pattern P2, which are not disposed inside the third conductive pattern P3, are indicated by hatching as illustrated in FIG. 6F.

The third conductive pattern P3 may further include connection portions P3-C1, P3-C2, and P3-C3 extending from the electrode portion P3-E. The connection portions P3-C1, P3-C2, and P3-C3 have a smaller area and a smaller width than the electrode portion P3-E.

The first connection portion P3-C1 extends in the second direction DR2 from the electrode portion P3-E. The first connection portion P3-C1 is connected to the drain or source (drain in FIG. 6F) of the fifth transistor T5 through the contact hole 114. The contact hole 114 is defined through the second insulating layer 20 and the third insulating layer 30 illustrated in FIG. 4.

The second connection portion P3-C2 extends in the first direction DR1 from the electrode portion P3-E. As illustrated in FIG. 6H, the second voltage line VL2 is connected to the second connection portion P3-C2 through a contact hole 204 defined through the fourth insulating layer 40.

The third connection portion P3-C3 extends in the first direction DR1 from the electrode portion P3-E. The electrode portion P3-E is disposed between the third connection portion P3-C3 and the second connection portion P3-C2 in the first direction DR1. The third connection portion P3-C3 connects the electrode portion P3-E to the third conductive pattern P3 of the adjacent pixel PXij+1.

Figure 6G:
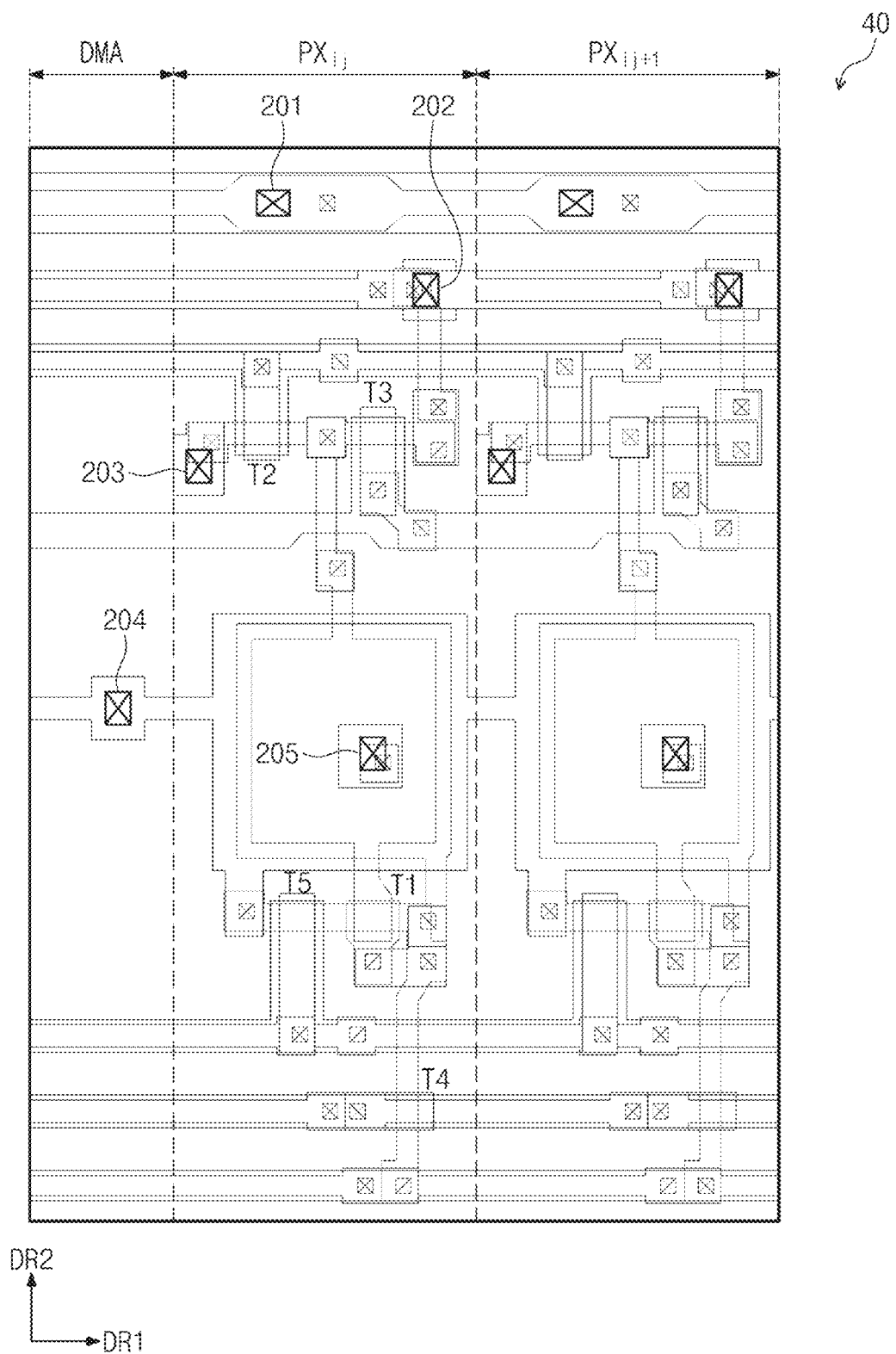
Figure 6H:
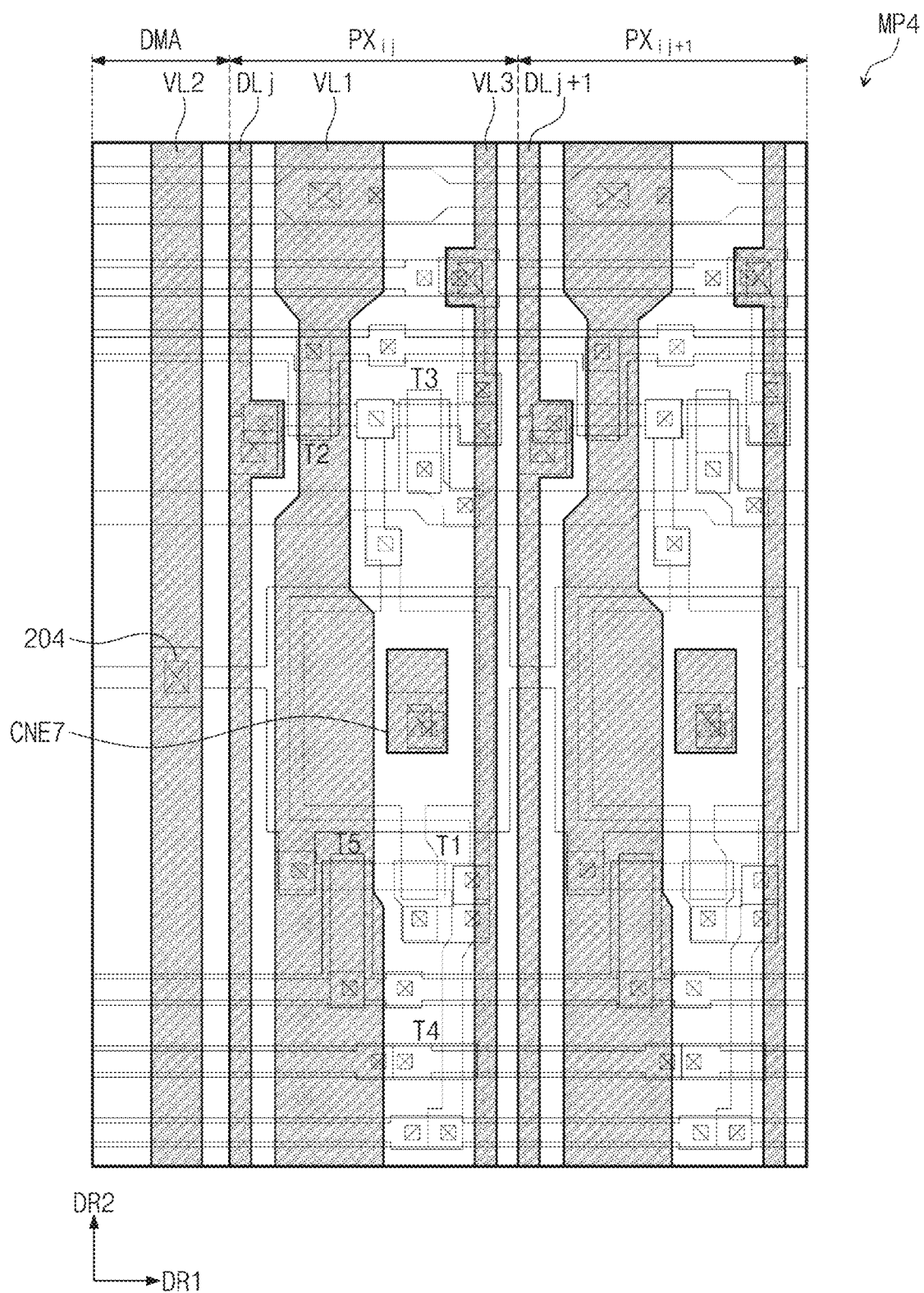

Referring to FIGS. 5 and 6G, the fourth insulating layer 40 is disposed on the third insulating layer 30 (see FIG. 4). FIG. 6G illustrates a plurality of contact holes 201 to 205 defined in the fourth insulating layer 40. The conductive patterns described with reference to FIGS. 6A to 6F and the conductive patterns illustrated in FIG. 6H to be described later are electrically connected to each other through the contact holes 201 to 205 to form the equivalent circuit of FIG. 2.

Referring to FIGS. 5 and 6H, the conductive patterns of a fourth conductive layer MP4 are disposed on the fourth insulating layer 40 (see FIG. 4). The fourth conductive layer MP4 includes a first voltage line VL1, a second voltage line VL2, a third voltage line VL3, a j-th data line DLj, a j+1-th data line DLj+1, and a seventh connection electrode CNE7.

Figure 7:
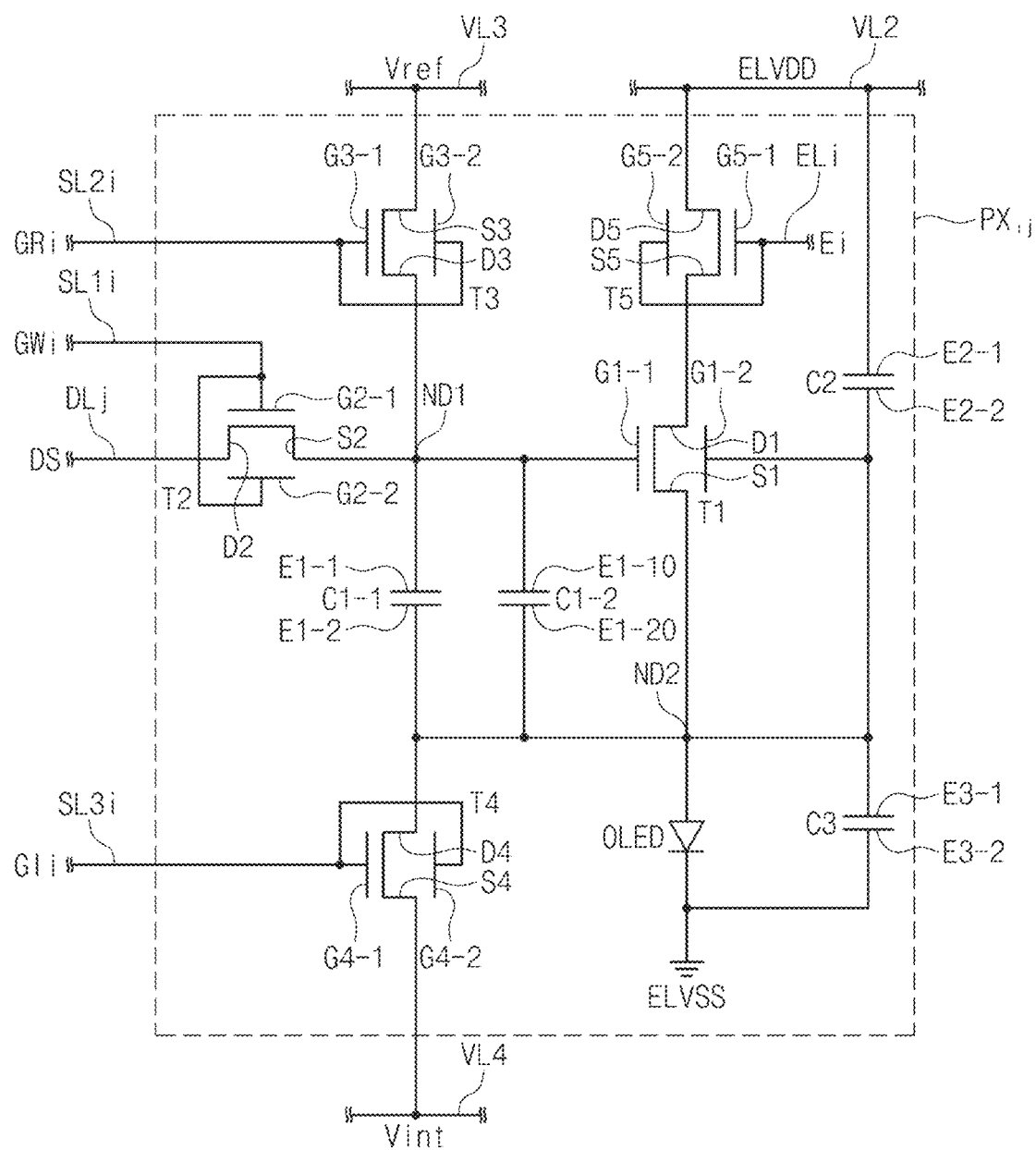
FIG. 7 is an equivalent circuit diagram of a pixel according to an alternative embodiment of the invention.
Figure 8:
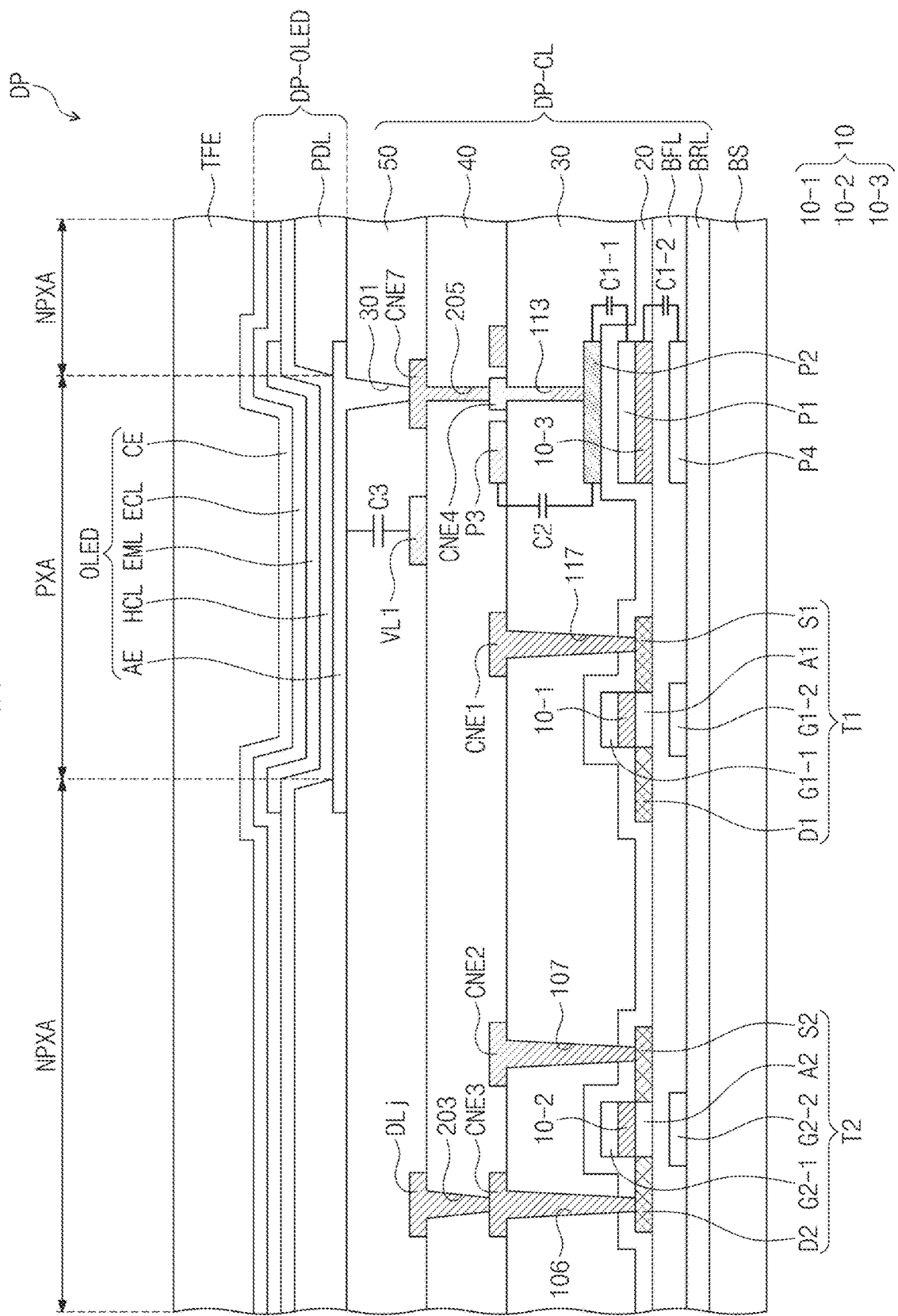
FIG. 8 is a cross-sectional view of a display panel corresponding to a pixel according to an alternative embodiment of the invention.
Figure 9A:
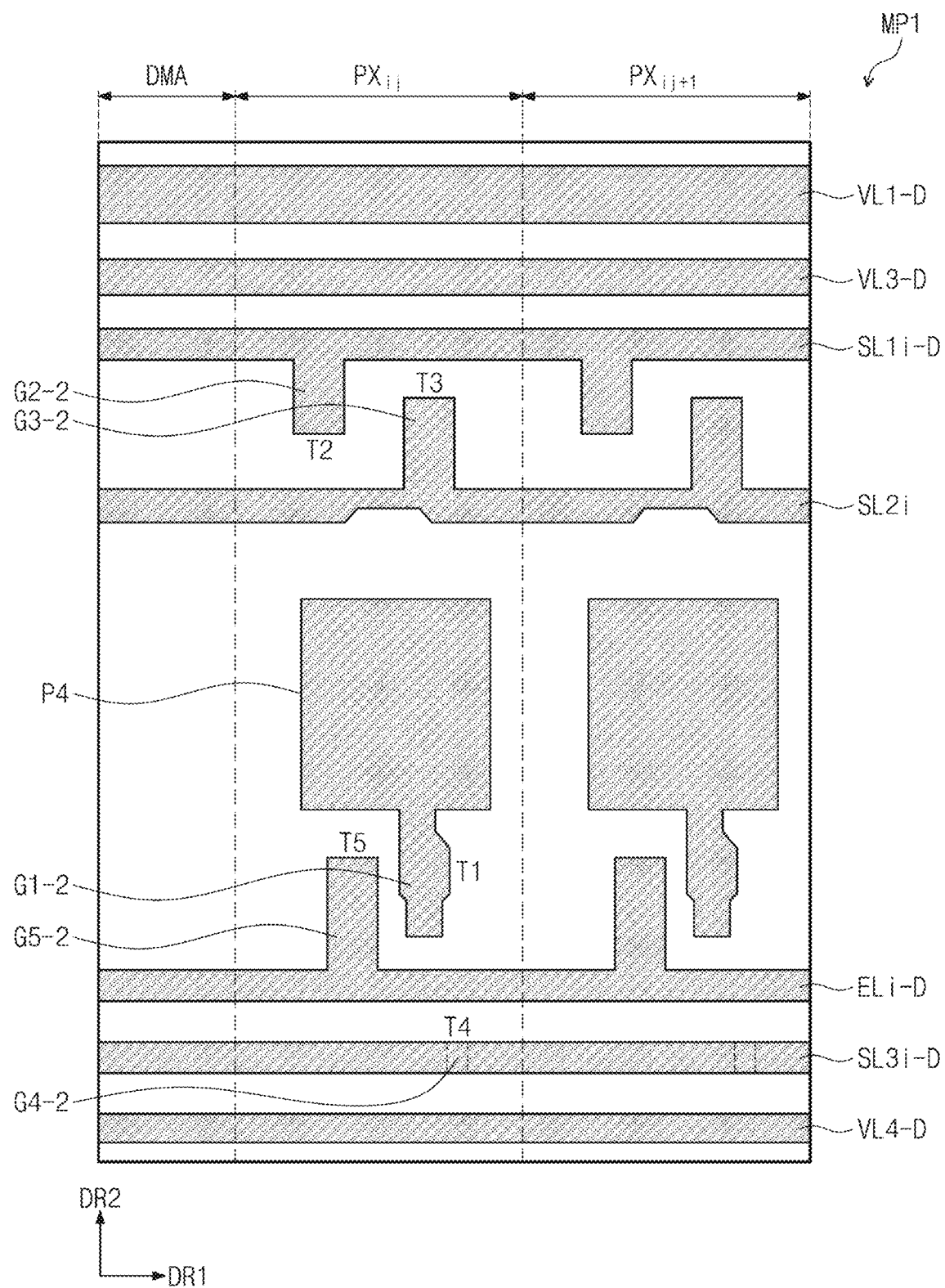
FIGS. 9A to 9B are plan views in accordance with a stacking order of patterns included in a pixel according to an alternative embodiment of the invention.
Figure 9B:
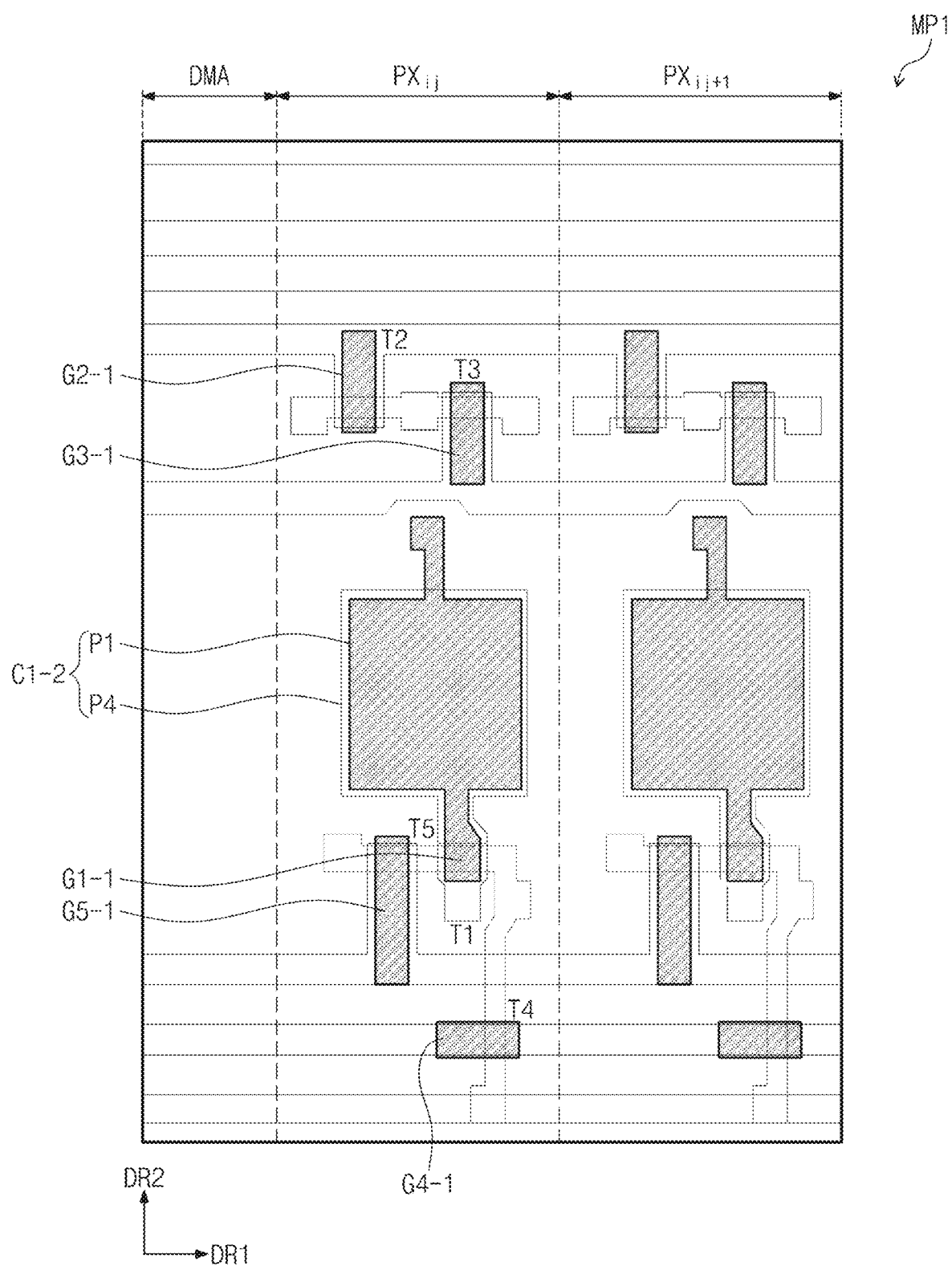

FIG. 7 is an equivalent circuit diagram of a pixel PXij according to an alternative embodiment of the invention. FIG. 8 is a cross-sectional view of a display panel corresponding to the pixel according to an alternative embodiment of the invention. FIGS. 9A to 9B are plan views in accordance with a stacking order of patterns included in the pixel PXij according to an alternative embodiment of the invention. FIG. 9A corresponds to FIG. 6A, and FIG. 9B corresponds to FIG. 6C. The same or like elements shown in FIGS. 7 to 9B have been labeled with the same reference characters as used above to describe those with reference to FIGS. 1 to 6G, and any repetitive detailed description thereof will hereinafter be omitted or simplified.

Referring to FIG. 7, an embodiment of the pixel PXij may further include a fourth capacitor C1-2. A capacitor C1-1 of FIG. 7 corresponds to the first capacitor C1 of FIG. 2. The first capacitor C1-1 is connected between the upper gate G1-1 and the source S1 of the first transistor T1, that is, between the control terminal and the output terminal of the first transistor T1. The fourth capacitor C1-2 is connected in parallel to the first capacitor C1-1. As a result, in such an embodiment, the pixel Pxij includes a storage capacitor having an increased capacity. The storage capacitor is a capacitor that receives a data signal. Even when coupling occurs between the gate of a driving transistor and the data line, since the capacity of the storage capacitor is increased, the variability of the gate-source voltage of the driving transistor, which may be caused by the data signal, is reduced.

Referring to FIG. 8, in an embodiment, the display panel DP further includes a fourth conductive pattern P4 disposed under the first conductive pattern P1. The first conductive pattern P1 corresponds to a first electrode E1-10 (see FIG. 7) of the fourth capacitor C1-2, and the fourth conductive pattern P4 corresponds to a second electrode E1-20 (see FIG. 7) of the fourth capacitor C1-2.

Referring to FIG. 9A, since the fourth conductive pattern P4 is formed through a same process as that of the first upper gate G1-1, the fourth conductive pattern P4 is disposed in a same layer as the first upper gate G1-1. The fourth conductive pattern P4 may have an integral shape with the first upper gate G1-1.

Referring to FIG. 9B, the first conductive pattern P1 overlaps the fourth conductive pattern P4. Substantially, the first conductive pattern P1 may be disposed inside the fourth conductive pattern P4.

In an embodiment, as described above, a distance between the gate of the driving transistor and the data line is relatively increased in the thickness direction of the display panel such that the coupling between the gate of the driving transistor and the data line may be reduced.

In an embodiment, the third conductive pattern that receives the second power voltage ELVDD may block the coupling between the gate of the driving transistor and the data line. In such an embodiment, since a distance between the gate of the driving transistor and the third conductive pattern may be relatively increased, a parasitic capacitance therebetween may be reduced.

In an embodiment, as the distance between the gate of the driving transistor and the data line is increased, the gate-source voltage of the driving transistor may be effectively prevented from being changed by the data signal. Accordingly, a luminance deviation occurring according to a position of a pixel may be reduced.

In an embodiment, the first capacitor and the fourth capacitor are connected in parallel to each other. Even when the coupling occurs between the gate of the driving transistor and the data line, since the capacity of the storage capacitor is increased, the variability of the gate-source voltage of the driving transistor, which may be caused by the data signal, is reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising a display panel including: a plurality of insulating layers; a first pixel electrically connected to a first data line extending in a first direction and a first scan line extending in a second direction crossing the first direction; and a second pixel electrically connected to a second data line extending in the second direction and the first scan line, wherein the first pixel comprises:
a light-emitting diode comprising a first electrode electrically connected to a first node, a second electrode which receives a first power voltage, and a light-emitting layer disposed between the first electrode and the second electrode;
a first transistor comprising a source, a drain, a semiconductor region, and a gate electrically connected to a second node, wherein the first transistor is electrically connected between a first voltage line which receives a second power voltage and the first node;
a second transistor electrically connected between the first data line and the second node;
a third transistor electrically connected between the second node and a second voltage line which receives a first voltage;
a first capacitor electrically connected between the first node and the second node;
a fourth transistor electrically connected between a third voltage line which receives a second voltage and the first node;
a fifth transistor electrically connected between the first voltage line and the drain or the source of the first transistor; and
a second capacitor electrically connected between the first voltage line and the first node, wherein:
the plurality of insulating layers comprises a first insulating layer and a second insulating layer disposed on the first insulating layer;
the gate of the first transistor is disposed below the first insulating layer;
a first conductive pattern defining a first electrode of the first capacitor is disposed below the first insulating layer;
a second conductive pattern defining a second electrode of the first capacitor and a first electrode of the second capacitor is disposed between the first insulating layer and the second insulating layer;
a third conductive pattern defining a second electrode of the second capacitor is disposed above the second insulating layer; and
the first data line is disposed above the second insulating layer and the third conductive pattern.

2. The display device of claim 1, wherein:
the second conductive pattern is disposed between the first data line and the second data line; and
a partial region of the third conductive pattern overlapping the second conductive pattern is disposed between the first data line and the second data line.

3. The display device of claim 2, wherein an opening is defined in the third conductive pattern in a plan view.

4. The display device of claim 3, wherein a connection electrode disposed through the opening electrically connects the second conductive pattern and the first electrode.

5. The display device of claim 2, wherein, when viewed in a plan view, the first conductive pattern and the second conductive pattern are substantially disposed in the third conductive pattern.

6. The display device of claim 1, wherein
the plurality of insulating layers further comprise a third insulating layer disposed on the second insulating layer,
the data line is disposed above the third insulating layer, and
the third conductive pattern is disposed under the third insulating layer.

7. The display device of claim 6, wherein a drain or a source of the fifth transistor is connected to the third conductive pattern through a first contact hold defined through the first insulating layer and the second insulating layer, and
wherein the third conductive pattern comprises:
an electrode portion substantially overlapping the first conductive pattern; and
a first connection portion extending in the first direction from the electrode portion and overlapping the first contact hole.

8. The display device of claim 7,
wherein the first voltage line is disposed on the third insulating layer and connected to the third conductive pattern through a second contact hole defined through the third insulating layer.

9. The display device of claim 8, wherein the third conductive pattern comprises a second connection portion extending in the second direction from the electrode portion and overlapping the second contact hole.

10. The display device of claim 1, wherein:
the display panel further comprises a conductive pattern overlapping the semiconductor region of the first transistor and disposed below the semiconductor region of the first transistor; and
the semiconductor region comprises a metal oxide.

11. The display device of claim 10, wherein the conductive pattern is electrically connected to the third conductive pattern.

12. The display device of claim 1, wherein:
the display panel further comprises conductive patterns;
each of the second to fifth transistors comprises a drain, a source, a semiconductor region, and a gate;
the semiconductor region comprises a metal oxide;
the semiconductor region of each of the second to fifth transistors overlaps a corresponding conductive pattern among the conductive patterns; and
the semiconductor region of each of the second to fifth transistors is disposed on the corresponding conductive pattern among the conductive patterns.

13. The display device of claim 12, wherein a gate of each of the second to fifth transistors is electrically connected to the corresponding conductive pattern.

14. The display device of claim 1, wherein the first pixel further comprises a third capacitor connected between the first electrode and the second electrode of the light-emitting diode.

15. The display device of claim 1, wherein:
the display panel further comprises a fourth voltage line disposed on the second insulating layer and extending in the second direction, wherein the fourth voltage line receives the first power voltage; and
the second voltage line and the third voltage line are disposed in a same layer as the fourth voltage line.

16. The display device of claim 15, wherein:
the display panel further comprises conductive patterns;
each of the second to fourth voltage lines overlaps a corresponding conductive pattern among the conductive patterns; and
the conductive patterns are disposed below the second to fourth voltage lines.

17. A display device comprising:
a light-emitting diode comprising a first electrode, a second electrode which receives a first power voltage, and a light-emitting layer disposed between the first electrode and the second electrode;
a switching transistor which outputs a voltage corresponding to a data signal from a data line;
a first capacitor which stores the voltage received from the switching transistor;
a driving transistor which controls an amount of current of the light-emitting diode to correspond to the voltage stored in the first capacitor; and
a second capacitor connected between a voltage line, which receives a second power voltage higher than the first power voltage, and an output terminal of the driving transistor,
wherein:
a gate of the driving transistor is disposed below a first insulating layer;
a first conductive pattern defining a first electrode of the first capacitor is disposed below the first insulating layer;
a second conductive pattern defining a second electrode of the first capacitor and a first electrode of the second capacitor is disposed on the first insulating layer;
a third conductive pattern defining a second electrode of the second capacitor is disposed on a second insulating layer covering the second conductive pattern; and
the data line is disposed above the second insulating layer and the third conductive pattern.

18. The display device of claim 17, wherein, when viewed in a plan view, the first conductive pattern and the second conductive pattern are substantially disposed inside the third conductive pattern.

19. The display device of claim 17, wherein an opening is defined in the third conductive pattern.

20. The display device of claim 17, further comprising:
a third capacitor connected in parallel to the first capacitor,
wherein:
the first conductive pattern defines a first electrode of the third capacitor; and
a fourth conductive pattern defining a second electrode of the third capacitor is disposed below the first conductive pattern and overlaps the first conductive pattern.

* * * * *